United States Patent
Sethumadhavan et al.

(10) Patent No.: US 9,554,463 B2
(45) Date of Patent: Jan. 24, 2017

(54) CIRCUIT MATERIALS, CIRCUIT LAMINATES, AND ARTICLES FORMED THEREFROM

(71) Applicant: Rogers Corporation, Rogers, CT (US)

(72) Inventors: Murali Sethumadhavan, Acton, MA (US); Ani Shere, Chelmsford, MA (US); Mike White, Pomfret Center, CT (US)

(73) Assignee: ROGERS CORPORATION, Rogers, CT (US)

( * ) Notice: Subject to any disclaimer, the term of this patent is extended or adjusted under 35 U.S.C. 154(b) by 0 days.

(21) Appl. No.: 14/638,272

(22) Filed: Mar. 4, 2015

(65) Prior Publication Data

US 2015/0257263 A1 Sep. 10, 2015

Related U.S. Application Data

(60) Provisional application No. 61/949,322, filed on Mar. 7, 2014, provisional application No. 61/949,318, filed on Mar. 7, 2014, provisional application No. 61/949,330, filed on Mar. 7, 2014.

(51) Int. Cl.

| | |
|---|---|
| *H01L 29/18* | (2006.01) |
| *H05K 1/03* | (2006.01) |
| *H01L 25/075* | (2006.01) |
| *H01L 33/48* | (2010.01) |
| *H01L 33/60* | (2010.01) |
| *H05K 1/02* | (2006.01) |
| *D21H 13/00* | (2006.01) |

(52) U.S. Cl.
CPC ............ *H05K 1/0366* (2013.01); *D21H 13/00* (2013.01); *H01L 25/0753* (2013.01); *H01L 33/486* (2013.01); *H01L 33/60* (2013.01); *H05K 1/0271* (2013.01); *H05K 1/0284* (2013.01); *H05K 1/038* (2013.01); *H01L 2924/0002* (2013.01); *H05K 1/0373* (2013.01); *H05K 2201/0141* (2013.01); *H05K 2201/0162* (2013.01); *H05K 2201/0191* (2013.01); *H05K 2201/0278* (2013.01); *H05K 2201/0293* (2013.01); *H05K 2201/068* (2013.01); *Y10T 428/2495* (2015.01)

(58) Field of Classification Search
CPC ..... H01L 25/0753; H01L 33/486; H01L 33/60

USPC .......................................................... 257/88
See application file for complete search history.

(56) References Cited

U.S. PATENT DOCUMENTS

| | | | |
|---|---|---|---|
| 6,071,836 | A | 6/2000 | St. Lawrence et al. |
| 6,229,096 | B1 | 5/2001 | Gaku et al. |
| 7,524,388 | B2 | 4/2009 | Roseen, Jr. et al. |
| 8,632,721 | B2 | 1/2014 | Andrady et al. |
| 2004/0142161 | A1* | 7/2004 | Kawakita ............. H05K 3/4069 428/321.3 |
| 2006/0258241 | A1 | 11/2006 | Roseen, Jr. et al. |
| 2007/0269655 | A1 | 11/2007 | Joo et al. |
| 2008/0113214 | A1 | 5/2008 | Davis et al. |
| 2009/0218672 | A1* | 9/2009 | Nakamura ............. B32B 27/12 257/690 |
| 2009/0232920 | A1 | 9/2009 | Lozano et al. |
| 2009/0269429 | A1 | 10/2009 | Lozano et al. |
| 2012/0003524 | A1 | 1/2012 | Jo et al. |
| 2012/0281428 | A1 | 11/2012 | Davis et al. |
| 2014/0035178 | A1 | 2/2014 | Kay et al. |
| 2014/0035179 | A1 | 2/2014 | Kay et al. |
| 2014/0159263 | A1 | 6/2014 | Lozano et al. |

FOREIGN PATENT DOCUMENTS

| | | |
|---|---|---|
| EP | 0908559 A2 | 4/1999 |
| WO | 2009140381 A1 | 11/2009 |

OTHER PUBLICATIONS

Patent Cooperation Treaty; International Searching Authority; Search Report; PCT/US2015/018841; Date of mailing: Aug. 17, 2015; 6 pages.
Patent Cooperation Treaty; International Searching Authority; Written Opinion; PCT/US2015/018841; Date of mailing: Aug. 17, 2015; 9 pages.

* cited by examiner

*Primary Examiner* — Hung Vu
(74) *Attorney, Agent, or Firm* — Cantor Colburn LLP

(57) ABSTRACT

A dielectric substrate comprises a resin composition impregnated with non-woven fibrous mat material having a thickness of 5 mils (127 micrometers), wherein the fibrous mat material comprises fibers, having a diameter of 1 nm to 10 µm, that have been extruded through one or more openings to produce fibers that have been collected in the form of a fibrous non-woven mat, and wherein the fibers exhibit a multi-directional orientation in the non-woven mat material. The dielectric substrate is useful in circuit materials, circuits, and multi-layer circuits, economical to make, and has excellent electrical and mechanical properties.

17 Claims, No Drawings

CIRCUIT MATERIALS, CIRCUIT LAMINATES, AND ARTICLES FORMED THEREFROM

BACKGROUND

This invention relates to dielectric substrates and, in particular, to thin dielectric substrates for use in circuit laminates and circuits, including multilayer circuits.

As used herein, a circuit material is an article used in the manufacture of circuits and multilayer circuits, and includes circuit laminates, bond plies, dielectric materials, conductive layers, resin coated conductive layers, and cover films.

Circuit laminates can have a conductive layer fixedly attached to a dielectric layer. When a second conductive layer is disposed on the other side of the dielectric layer, the material is often referred to as a double clad circuit laminate. Patterning a conductive layer of a circuit laminate, for example by etching, provides a circuit, or in the case of a double clad circuit laminate, a double clad circuit. One or both of the conductive layers of a double clad laminate can be processed to provide circuit layers.

The aforementioned circuit materials and circuits can be combined in various configurations to provide multilayer circuits. "Multilayer circuits" as used herein refers to materials having at least two dielectric layers and at least two conductive layers, wherein at least one of the conductive layers is circuitized, and is inclusive of both subassemblies used to form finished circuits and the finished circuits themselves.

In one simple form, a multilayer circuit includes a double clad circuit and a resin coated conductive layer, wherein the dielectric material of the resin coated conductive layer is disposed on a circuit layer of the double clad circuit. In another simple form, a multilayer circuit includes a first circuit and a second circuit joined by a bond ply, to provide adhesion, disposed between the circuit layer of the first circuit and the dielectric substrate of the second circuit. Typically, such multilayer circuits are formed by laminating the circuit(s) and/or circuit material(s) in proper alignment using heat and/or pressure. In place of a conductive layer bonded to a circuit with a bond ply, the multilayer circuit can include a resin coated conductive layer bonded directly to the outer layer of a circuit. In such multilayer structures, after lamination, known hole forming and plating technologies can be used to produce useful electrical pathways between conductive layers.

A dielectric layer (also referred to as a "substrate" for attachment to another layer, for example a conductive layer, or a "circuit substrate" for supporting a circuit) can comprise a fibrous mat or other form of reinforcement. Suitable fibrous mat reinforcement can be composed of glass fibers or, alternatively, of polymeric fibers having good dielectric properties, such as aromatic polyamides ("aramids").

A liquid crystalline polymer in the form of a non-woven fibrous mat is commercially available from Kuraray America Inc., New York, N.Y., under the trade name VECRUS. Liquid crystalline polymer mats are described in U.S. Pat. No. 6,229,096, which is incorporated herein by reference in its entirety. The mats described therein comprise liquid crystalline fibers and a binder, wherein the fiber-binder combination is provided with sufficient porosity to allow infiltration of a resin composition. For example, U.S. Pat. No. 7,524,388 discloses a method of forming a reinforced dielectric substrate comprising contacting a liquid crystalline polymer fibrous mat, having a thickness of 5 mils (127 μm) or less, with a resin composition to form a dielectric composite layer, wherein the contacting is carried out under vacuum, followed by pressure. The method is referred to as vacuum pressure impregnation (VPI).

While there are a variety of reinforced substrate materials available today, for example FR4 epoxy glass laminates and the like, there is a growing demand for improved and thinner reinforced substrate materials for high performance (high frequency) applications, that is, applications operating at 1 gigahertz (GHz) or higher. As the complexity of multilayer circuits increases, there is an incentive to reduce the thickness of the dielectric layers of multilayer circuits. Thinner dielectric layers enable the addition of more layers of circuitry, enable the weight and dimensions of the circuit boards to be as low as possible, and allow addition of more interconnect circuitry to be incorporated into a single board. Thin ultra-low-loss materials are needed for digital applications in particular.

It is difficult, however, to achieve thinner dielectric layers and still maintain good mechanical and electrical properties. The thickness of a laminate comprising a glass fabric is determined by the glass fabric. As the thickness of the glass fabric goes down, the strength of the fabric is reduced, which can lead to distortion of the fabric during the impregnation process in which the reinforced substrate is produced. The properties of the fabric can also be inconsistent at the "knuckles," where fibers overlap or cross over, since there would be more glass at the knuckles than at other places. As the laminate becomes increasingly thinner, the dielectric properties at these knuckles can become increasingly worse than at other parts of the laminate.

Non-woven fibrous mats have been considered as one possible solution for this problem. Such non-woven fibrous mats comprising chopped fibers, however, tend to have insufficient or low strength. Furthermore, they can also exhibit a mismatched CTE (coefficient of thermal expansion) along the x- and y-axes. Thus, while non-woven fibers can have better electrical properties than glass fibers, the non-woven fibrous mats can be very anisotropic. In fact, the CTEs can be quite different in x- and y-directions, which can lead to warping of the substrates during lamination.

Furthermore, very thin fibrous mats, less than or equal to about 4 mils (100 μm), can be prone to dimensional distortion when placed under mechanical stresses, for example, the stresses associated with the manufacture of reinforced prepregs and circuit laminates. The process of impregnating the mat, curing, heating, pressing, rolling, laminating, cutting, and the like can result in dimensional distortion in the x-y plane, thinning (which results in non-uniform thickness), and even tearing. Non-woven fibrous mats comprised of chopped fibers can be especially prone to these defects.

What is needed, therefore, is a dielectric substrate having a thin non-woven fibrous mat material incorporated therein that has good mechanical and electrical properties, for example, low coefficient of thermal expansion (CTE) in all directions and low dissipation factor.

SUMMARY

The above discussed and other drawbacks and deficiencies of the prior art circuit materials can be overcome or alleviated by a dielectric substrate comprising a fibrous non-woven mat material having a thickness of less than 5 mils (127 micrometers) that is impregnated with a resin composition, wherein the fibrous non-woven mat material comprises fibers, 10 nm to 10 μm in diameter, which fibers have been made by a process of extruding an inorganic or organic polymer through one or more openings and collecting the extruded fibers in the form of a fibrous non-woven mat such that the orientation of the fibers in the fibrous non-woven mat material is multi-directional, not unidirectional in any direction. The process of manufacturing the fibers, specifically the process of spinning the fibers, characterizes the dimensions and directional orientation of the fibers in the fibrous mat. Thus, the fibers' lengths (median and distribution) and directional orientation (standard deviation) in the fibrous mat reflect the spinning process used in forming the fibrous mat for a variety of inorganic or organic fiber materials, for example, silica or liquid crystalline polymer.

In one aspect of the invention, a dielectric substrate comprising a fibrous non-woven mat material having a thickness of less than 5 mils (127 micrometers) that is impregnated with a resin composition, wherein the fibrous non-woven mat material comprise fibers, 10 nm to 10 μm in diameter, of a liquid crystalline polymer, wherein liquid crystalline polymer is extruded through one or more openings as the one are more openings are rotated about an axis, in a force spinning process, thereby producing fibers collected in the form of a fibrous non-woven mat.

In another aspect, a dielectric substrate comprising a dielectric substrate comprising a fibrous non-woven mat material having a thickness of less than 5 mils (127 micrometers) that is impregnated with a resin composition, wherein the fibers of the fibrous non-woven mat material, having a diameter of 10 to 10000 nanometers, have been made by force spinning a liquid crystalline polymer through one or more openings rotating about an axis at a speed of about 500 RPM to about 25,000 RPM, which openings are positioned to extrude the liquid crystalline polymer at an angle to the axis of rotation, wherein centrifugal forces have been employed to transform the liquid crystalline polymer into fibers collected in the form of a fibrous non-woven mat, wherein the liquid crystal polymer fibers on the surface of the fibrous non-woven mat exhibit a directional orientation represented by a standard deviation of at least 10 degrees relative to a longitudinal central axis of the fibrous non-woven mat, and wherein the liquid crystal fibers have not been exposed to mechanical division prior to collection in the form of a fibrous non-woven mat.

Yet another aspect is directed to a dielectric substrate comprising a fibrous non-woven mat material having a thickness of less than 5 mils (127 micrometers) that is impregnated with a resin composition, wherein the fibrous non-woven mat material comprises silica fibers, having a diameter of 100 nanometers to 10 micrometers, which fibers have been made by electrospinning a silica precursor sol-gel composition, wherein the silica fibers of the fibrous mat material are characterized by (i) lengths that are a consequence of the fibers having been formed substantially continuously during electrospinning and (ii) substantially random surface direction with respect to a central longitudinal axis of the fibrous non-woven mat material.

Still another aspect is directed to a dielectric substrate comprising a fibrous non-woven mat material having a thickness of less than 5 mils (127 micrometers) that is impregnated with a resin composition, wherein the fibrous non-woven mat material comprises fibers, 100 nm to 10 μm in diameter, of silica or liquid crystalline polymer, wherein the fibers have been made by a force spinning or electrospinning process, wherein the spun fibers are collected in the form of a fibrous non-woven mat.

Dielectric substrates, circuit materials, circuits, and multilayer circuits comprising the impregnated mat are also disclosed.

The features and advantages of the present invention will be appreciated and understood by those skilled in the art from the following detailed description and drawings.

DETAILED DESCRIPTION

This invention is based on using a non-woven fibrous mat as a reinforcing medium for a dielectric substrate in circuit materials. The fibrous mat can enable very thin high frequency substrate materials with consistent electrical properties throughout a board. Another potential advantage is that, due to the micro or nano scale of the fibers in the mat, the dielectric properties of the mat are spatially uniform at a very small scale compared to commercial glass mats/cloth, which improvement can allow improved digital signal propagation designs given that the copper channel width is many times larger than the fiber diameter.

In particular, the dielectric substrate comprises a fibrous mat impregnated with a resin composition. The fibrous mat can be in the form of one or more non-woven sheets. Suitable materials for forming the fibers of the mat can withstand the processing conditions used in the manufacture of circuit materials and circuits and specifically do not adversely affect, to any undesirable extent, the dielectric or other properties of the dielectric substrate, for example, with respect to flame retardance, moisture absorption, dimensional stability, and the like.

The term "nanofibers" refers to fibers that have a minimum diameter in the range of 1 nanometer to 1000 nanometers; or specifically from 10 nanometers to 500 nanometers, or more specifically from 20 nanometers to 250 nanometers. The term "microfibers" refers to the fibers having a minimum diameter of 1 micron and less than 10 microns. Fibers can be analyzed via any means known to those of skill in the art. For example, Scanning Electron Microscopy (SEM) can be used to measure dimensions of a given fiber.

While typical cross-sections of the fibers are circular or elliptic in nature, they can be formed in other shapes by controlling the shape and size of the openings in a spinneret, syringe, or similar fiber producing device.

The term "mat," as used herein, is intended to mean, globally at least, a substantially flat or planar material having extended opposite sides, which mat can be, for example, in the form of a rectangular sheet or a continuous web. These mats would be made from long fibers that, at least partially, are randomly distributed in orientation, as observed in top plan view of the fibrous mat. This random orientation can contribute to obtaining the same mechanical properties of the mat in both x- and y-directions. The fibers can exhibit a significant variation from a unidirectional orientation as they are laid down at an extended length compared to chopped fibers used to make a fibrous mat.

In one embodiment, for example, silica fibers made by a process of electrospinning can form a fibrous silica mat, which fibers are relatively long fibers as a result of the process of electrospinning, in which the fibers can be formed essentially continuously from a spinneret during electrospinning. In other words, the fibers are not chopped or otherwise subjected to mechanical division prior to being collected in a mat. The long fibers can be aligned in the fibrous silica mat at random to a significant extent, as viewed from the planar surface. This would insure the same mechanical properties of the mat in both x- and y-directions.

The fibrous silica mats can be electrospun to obtain lower thicknesses than with woven glass fabrics. Specifically, non-woven fibrous silica mats can be made out of fibers, less than 5 micrometers in diameter, that have more strength than conventional non-woven mats, wherein the mats are made of continuously formed fibers as compared to the relatively shorter fibers of conventional non-woven mats. Consequently, spatially more uniform $D_k$ and $D_f$ can be obtained due to the presence of silica fiber intersections that can be fused in a single plane, reducing the number or size of knuckles.

In one embodiment, the fibers of fibrous silica mat are continuously formed and randomly arranged by electrospinning a silica precursor sol-gel solution. By "continuously formed" is meant that the spinning of the silica precursor sol-gel composition is not intentionally interrupted, such that fibers having a length of at least 10 cm, specifically at least one meter and are laid down in substantially random directions on a substrate or collector for the fibers. Specifically, the fibrous silica mat can comprise fibers formed at a length of 10 cm to over several meters, more specifically formed at a length greater than 50 cm, most specifically at a length greater than 100 cm.

In particular, silica fibers can be continuously formed by electrospinning a silica precursor sol-gel composition through a nozzle under a high-voltage electric field, wherein silica fibers having a diameter ranging from several nm to 10 micrometers can be formed at a length ranging from 10 cm to 1 meter or more. The fibrous silica mat comprises fibers that can be laid down in a randomly arranged direction.

Electrospinning of fibers, nanofibers or microfibers, is an established method for making fibers out of various materials. The principle of electrospinning to form ultrafine continuous fibers of silica is well disclosed in various patents, including for example U.S. Pat. No. 8,632,721 and US Patent Application Publications 2012/003524 and 2007/0269655 (and references cited therein), which three references are hereby incorporated by reference in their entireties. As shown in the prior art, silica or other metal oxide precursor solution can have a sufficiently low viscosity to be formed into ultrafine fibers under a high-voltage electrostatic force, in accordance with conventional electrospinning, as can be appreciated by one of ordinary skill in the art.

Electrospinning is a fiber formation process that relies on electrical rather than mechanical forces to form thin fibers with diameters ranging between about 100 nm and about 10.0 microns. A strong electric field is used to draw a solution from the tip of a capillary to a grounded collector. The electric field causes a pendant droplet of the solution at the capillary tip to deform into a conical shape. When the electrical force at the surface of the tip overcomes the surface tension of the solution, a charged jet is ejected. The jet moves toward a collector plate, which acts as a counter electrode. The solvent begins to evaporate after jet formation, causing the deposit of a thin fiber on the collector. To the extent solvent remains, the fibers can be heated to about 150° C. to remove residual solvent.

In one embodiment, an electrospinning apparatus comprises a syringe or other device with at least one opening or tip (also commonly referred to as a "spinneret" or "extrusion element"), a high voltage supplier positioned at or near the tip, and a collection plate constructed of a conductive material, such as aluminum, stainless steel or surface-oxidized silicon. The diameter of the fibers can be decreased by decreasing the inner diameter of the spinneret. The collector can be grounded to create an electric field difference between the tip and the collector, causing a jet to move from the high electric field at the tip to the grounded collector.

A fiber-forming composition can be placed into the syringe and pumped there through at a relatively constant flow rate. As pumping continues, a charged jet is ejected and elongates as it moves towards the collector. Thus, a plurality of randomly oriented non-woven ultra-thin fibers, microfibers or nanofibers, can be collected on a collector.

More specifically, the high voltage source can be provided to maintain the extrusion element at a high voltage. The collector can be placed, for example, 1 to 100 cm away from the tip of the extrusion element. The collector can be a plate or a screen. Specifically, an electric field strength between 2,000 and 400,000 V/m can be established by the high voltage source. The high voltage source can include a DC source such as, for example, Bertan® Model 105-20R (Bertan, Valhalla, N.Y.) or Gamma® High Voltage Research Model ES30P (Gamma High Voltage Research Inc., Ormond Beach, Fla.). Typically, the collector is grounded, and the fibers produced by electrospinning from one or more extrusion elements can be directed by the electric field toward the collector. In one embodiment, the electrospun fibers can be collected by a collecting mechanism in the form of a conveyor belt. The collecting mechanism can transfer the collected fibers to a removal station where the electrospinning fibers are removed before the conveyor belt, which returns to collect more fibers. Besides a conveyor belt, the collecting means can be, for example, a mesh, a rotating drum, or a foil. In one embodiment, the electrospun fibers are deposited on a stationary collecting mechanism, accumulated thereon, and subsequently removed in a batch process. On the other hand, a continuous process in which fibrous mat is produced in the form of a web can be adapted to being used in the continuous production of a web of reinforced dielectric material in the manufacture of prepregs.

The use of a rotatable spray head, when spun at high angular speeds, can increase the directional orientation of the deposited fibers. With no angular rotation, however, a standard deviation of the deposited fibers can be obtained that is substantially random, i.e., that is about 25 to 45°, specifically 30 to 45°, more specifically 40 to 45° relative to a central longitudinal direction (i.e., relative to an angle of 90° in a planar view of the fibrous mat, which randomness can be measured and recorded in accordance with a constructed histogram, as disclosed in U.S. Pat. No. 8,632,721, hereby incorporated by reference). In certain embodiments at least some of the fibers that are collected are essentially continuous, although a mixture of continuous and non-continuous or shorter fibers can be used.

In one embodiment, an electrospinning device includes a barrel or reservoir for storing the fiber material, for example, a silica precursor solution (inclusive of sol-gel liquids), a pump for discharging the fiber material at a predetermined rate, and a spinning nozzle connected to a high-voltage generator. For example, a silica precursor solution can be discharged via the pump in the form of ultrafine fibers while passing through the spinning nozzle electrically charged by the high-voltage generator. Porous ultrafine fibers can be accumulated on a grounded metal collector plate, for example, a conveyor that moves at a predetermined rate. Ultrafine fibers having a size ranging from several to several thousand nm can be produced and simultaneously can be fused and layered in a three-dimensional network structure, resulting in the desired porous mat comprising for a dielectric substrate.

In one embodiment, the final product generated by the above-described electrospinning process is a fibrous silica mat in which silica fibers within the mat can be adhered to one another in the presence of residual solvent. The silica fibers can comprise a three-dimensional silica-based network. The fibers can be calendared to remove undue knuckles.

Specifically, the diameter of the silica fibers in the fibrous silica mat can fall in the range of 1 nm to 10,000 nm, specifically 10 nm to 1000 nm. The porosity of the fibrous silica mat can be 10 to 85%, specifically 20% to 80%, referring to the spaces between fibers which are defined by the tiny interstices or gaps between the randomly dispersed nanofibers that form the mat. The "porosity" of a fibrous mat can be measured based on grams per square meter of the fibrous mat (which, in turn, determines how much fibers are put in per square meter).

Under the generic name of electrospinning discussed above, melt-blowing, flash spinning, or electro-blowing can be employed to form the fibrous mat. All of these methods have in common the concept of electrospinning, wherein extrusion using a nozzle or the like occurs under an electric field.

More specifically, a fibrous silica mat can be obtained by electrospinning a silica precursor sol-gel solution comprising a solvent such as water, alcohol or a mixture thereof. The alcohol can include a lower alcohol having a low carbon number, specifically 1 to 6 carbons ($C_1$ to $C_6$), such as methanol, ethanol, propanol, butanol, etc., and mixtures thereof. In one embodiment, the electrospinning of the silica precursor sol-gel solution can be combined with a polymer resin solution to add flexibility to the fibrous mat, wherein the silica fibers in the fibrous silica mat comprise at least 60 weight percent silica, specifically at least 80 wt. % silica, more specifically at least 90 wt. % silica, as determined by an elemental analysis. In one embodiment, the electrospinning can be carried out at a temperature ranging from room temperature to 150° C. The silica sol-gel reaction may progress quickly at a temperature higher than the latter upper limit, which can bring out undesirable precipitation of silica particles and solidification of the solution making its electrospinning difficult or impossible.

In the manufacture of silica fibers, the goal of the sol-gel synthesis is to yield a reaction product comprising a relatively high elongational viscosity, in one embodiment between about 1,000 poise to about 3,000 poise, for example, 2,000 poise to about 2,500 poise. To achieve the appropriate elongational viscosity, the molar ratio of inorganic material to solvent to water to catalyst can be adjusted. For example, in a sol-gel synthesis reaction using an alkyl orthosilicate such as tetraethyl orthosilicate ("TEOS") as the silica precursor, the TEOS can be added to a solvent of ethanol and water, followed by the dropwise addition of a catalyst, comprising a solution of water and hydrochloric acid, with vigorous stirring. In one embodiment, the overall molar ratio of $TEOS:EtOH:H_2O:HCL$ is specifically 1:2:2:0.01. Polymeric organic binders such as polyvinyl alcohol can be optionally employed to adjust the properties of silica fibers. After vigorous mixing to produce a homogeneous solution, the solution can be heated to an elevated temperature, for example, placed in a 50° C. oven, to accelerate the sol-gel transition and produce a dispersion comprising linear chains of silica suspended within the dispersion, which can be subjected to electrospinning. In particular, after ripening for several hours, the solution can be electrospun with an applied voltage of 20 kV, for example at a flow rate of 0.03 ml/min and a tip to collector distance of 4.5 inches. Under such conditions, continuous, nanoscale fibers can be obtained. The electrospun fibers can be heated, for example to 150° C., to remove residual solvents.

Process of electrospinning of silica fibers, disclosed in the prior art for purposes other than the their use in dielectric substrate or other circuit material, can be adapted to the present purpose. For example, a TEOS sol-gel solution can be prepared from a mixture of 20.8 g of tetraethoxyorthosilicate (TEOS), 9.2 g of ethyl alcohol, 3.5 g of water and 0.1 g of an aqueous hydrochloric acid solution, stirring at about 70° C. for about 3 hours, which TEOS sol-gel solution can then be electrospun using a 30 G spinning nozzle at a delivery rate of 20 µl/min under a high-voltage electric field of 20 kV by means of a conventionally designed electrospinning device, thereby manufacturing an ultrafine fibrous silica mat. Such a fibrous mat can be optionally sintered at about 400° C. to obtain a fibrous silica mat comprising silica fibers having an average diameter of about less than 1 micrometer, as measured using a TEM image of the silica fibers or any other means known to those of skill in the art, for example, Scanning Electron Microscopy (SEM).

Silica nanofibers can exhibit a three-dimensional network structure and comprise silica —$SiO_2$— repeat units. Such structure can advantageously exhibit high thermal stability. In fact, the melting point of such nanofibers can be above about 800° C., specifically up to about 1,500° C.

A non-woven fibrous mat can also be used to significantly improve the reflective properties of an LED (light emitting diode) assembly. In particular, polymeric fibers in the form of a mat can be used as a heat-resistant light-reflective solder mask (or as a non-heat-resistant reflective cover for a solder mask) on LED-mounted circuit substrates. In one case, the fibrous mat comprises fibers of a polymeric material that can pass the demands of soldering or other processing, commonly at about 260° C. or above; in an alternative embodiment, the fibrous mat cannot pass the demands of soldering and hence is applied to the LED assembly after soldering of the circuitized substrate. A solder mask, also referred to as solder stop mask or solder resist, is typically a thin layer of polymer that is usually applied to conductive surface areas on a LED device for protection against oxidation and to prevent solder bridges from forming between closely spaced solder pads. A solder bridge is an unintended electrical connection between two conductors by means of a small blob of solder, and solder masks are intended to prevent this from happening. Openings must be made in a global solder mask wherever components are soldered, which can be accomplished using photolithography. A solder mask can be exposed to temperatures of 260° C. and above during soldering operations.

Thus, for example, a light-emitting diode assembly can comprise a light emitting diode mounted on a circuitized substrate in which a solder mask is present that comprises a fibrous mat of polymeric fibers that diffusively reflects light, wherein the fibrous mat has been made by electrospinning a polymer composition, wherein the solder mask is heat resistant to the solder used in preparing the soldered light-emitting diode assembly.

In another embodiment, a light-emitting diode assembly comprises a light emitting diode mounted on a circuitized substrate in which a high-reflectance fibrous mat has been applied (for example, with adhesive) after the soldering of wire leads, chip etc. to an insulated metal substrate (IMS) or metal core printed circuit board (MCPCB) fabricated for the thermal management of LED applications. In this embodiment, the high-reflectance fibrous mat can be used to cover a previously applied solder mask and can optionally also cover other surface areas of the circuitized substrate in order to maximize light reflectance. The high-reflectance fibrous mat can be made by die-cutting or otherwise patterning the mat material to the shape that is needed to cover as much area of the substrate surface as desired or can be directly formed on the substrate surface, for example by means of screen printing of the polymeric fibers. Thus, the fibrous mask can be used to cover not just copper or other metal surface, but a dielectric layer or a combination of metal and dielectric surface.

The use of a fibrous mat for lighting applications, in which the mat is used as a high reflectance solder mask, or even as a high reflectance material without solder resistance properties to cover a standard solder mask, can offer significant improvement in the reflectance properties of an LED assembly, especially for high brightness LED applications (HBLED). In particular, improved reflectance from the exposed surface of an IMS or MCPCB LED package can be obtained compared to an LED assembly comprising conventional solder masking.

In particular, in one embodiment, a diffusively reflective fibrous mat is made using an electrospinning process and subsequently deposited onto an IMS substrate by using a pressure sensitive adhesive (PSA). Examples of adhesive materials can include an acrylic monomer, acrylic oligomer, acrylic polymer, acetate polymer, and styrene polymer. Other adhesive materials include polyurethane-based PSA and silicone-based PSA. For example, a PSA for attaching the fibrous nanofibers mat to the LED submount, before or after soldering, can comprise at least one material selected from the group consisting of vinyl acetate, methyl methacrylic acid, ethyl acetoacrylate, and sulfonated polystyrene. Specifically, pressure sensitive adhesives can include acrylic pressure sensitive adhesives, such as POL-942 series of solvent-borne acrylic pressure sensitive adhesives from Cosmotec Co., Ltd. Aroset® 1450 commercially available from Ashland and Gelva® 1159 from Solutia, Inc., St. Louis, Mo. Optionally, isocyanate, epoxy, or metal chelate cross-linking agent can be used to increase thermal resistance and cohesive strength of the adhesive layer. In one application, the adhesive layer requires sufficient adhesiveness so that the non-wove fibrous mat can be securely attached to the LED assembly. The thickness of the adhesive layer can be, for example, 1 to 50 micrometers.

A fibrous mat in which the fibers are made of high-temperature resistant polymers can provide solder resistance for the surface of an LED assembly. Specifically, the fibrous mat can be made of a polymeric composition for use as a solder mask, wherein the solder mask has a melting point or transition glass temperature higher than the point of the solder, specifically greater than 200° C., more specifically greater than 260° C. for some conventional soldering materials. Thus, a mat/adhesive composite can be attached to a circuitized IMS instead of applying the standard solder mask paste, so long as the fiber composition and optional adhesive can comprise polymeric materials that can withstand the solder temperatures used in preparing LED assemblies.

In an alternative embodiment, a mat/adhesive composite can be attached on top of the IMS substrate after soldering to the substrate has been completed. In this case, the diffusively reflective fibrous mat and optional adhesive need not be able to withstand solder temperatures.

The use of such solder masks (or covers for solder masks) that comprise one or more diffusively reflective fibrous mats according to the present invention, for application to insulated metal substrates used in the mounting of an LED device, can improve the reflectivity from 80% (for a white solder mask) to at least about 85%, specifically over 90%, more specifically over 95%, most specifically to 96-99%, in the light wavelength range of 380 nm to 750 nm, which encompasses useful white light.

The more diffusively reflective fibrous mats are using in preparing an LED (light-emitting semiconductor) assembly that typically comprises at least one light-emitting semiconductor element (chip), leads connected to the light-emitting semiconductor element, a wire or equivalent means connecting a lead to the light-emitting semiconductor chip. The above-described solder masks can peripherally surround the light-emitting semiconductor element, and can provide global or non-global in surface coverage. The solder mask can be a single integral shape in an LED assembly or can comprise a plurality of separate mats.

The specific polymers for making the fibers of the diffusively reflective fibrous mat can be selected based on their melting point or transition glass temperature. For the purposes of a solder mask, that temperature can be at least 260° C. Accordingly, among the polymers that can be used to form a fibrous mat employed as a solder mask are heat-resistant resistant polymers having a melting point or transition glass temperature of at least 260° C., for example, certain polyamides or aromatic polyesters.

To contribute to the reflectance, titanium dioxide, a white inorganic particulate material, can be mixed with the heat-resistant polymer. Other white inorganic materials, in addition to titanium dioxide, that can contribute to the reflectivity of the polymeric composition can include potassium titanate, zirconium oxide, zinc sulfide, zinc oxide, magnesium oxide, alumina, antimony oxide, aluminum hydroxide, barium sulfate, magnesium carbonate, barium carbonate, or the like, and mixtures thereof. The unit lattice of titanium dioxide can be of any one of the rutile type, anatase type, and brookite type.

As indicated above, the fibrous mat can have a light reflectivity at 380 to 750 nm greater than 80%, specifically 85% or higher. A reflectivity of 90% or higher at any selected wavelength greater than 440 nm can be obtained. Specifically, a reflectance at 460 nm of 85 to 98 percent, specifically at least 88 percent, more specifically at least 90 or 91 percent can be obtained. Reflectivity can be obtained in the range from 380 nm to 750 nm of 85 to 98 percent, specifically at least 90 percent, more specifically at least 91 or 93 percent.

Reflectance can be measured using a Color-Eye® 7000A using 2.54 mm color chip. Initial luminous flux (λ) was obtained from a 3000K Hikari® light source. Reflectivity (%) can be calculated by the following equations:

$$\rho(\lambda) = \frac{G_{refl}(\lambda)}{G_{incid}(\lambda)}$$

$$G_{refl}(\lambda) = \int_{380\,nm}^{750\,nm} \text{Initial luminous flux } (\lambda) \times \text{Reflectance } (\lambda)$$

$$G_{incid}(\lambda) = \int_{380\,nm}^{750\,nm} \text{Initial luminous flux } (\lambda)$$

As mentioned above, one embodiment is directed to a light-emitting semiconductor assembly or package comprising solder mask, wherein the solder mask is in the form of an electrospun fibrous mat in which the fibers comprise a polymer that is heat-resistant (solder-resistant) and has a melting point or transition glass temperature higher than the point of the solder. A "package" is defined to mean a printed circuit board including at least one, specifically a plurality of LED devices.

The solder mask can have a melting point below 260° C. so long as the solder that is used melts below 260° C. While less common than higher melting lead solders, such low melting solders can advantageously cause less damage to a device and allow a reduction in electric power in a reflow process. Conventional low-temperature solders can, for example, include Sn—Bi—Pb, Sn—Bi—Cd, Sn—Pb—Bi, Sn—In, Sn—Bi, Sn—Pb—Cd, Sn—Cd alloys, as described, for example, in U.S. Pat. No. 8,303,735, ranging in melting point from 95 to 175° C. A lead-free low-temperature soldering alloy can comprise gold, tin and indium. When using such low temperature solders in an LED package, the heat-resistant polymer used for making the fibrous mat can have a melting point or glass transition temperature of less than 260° C. and still be solder resistant.

As described in U.S. Patent Publication 20012/0281428, fiber materials can exhibit excellent broad spectrum reflectance in the visible spectrum. The value of the reflectance is to some extent dependent upon several parameters including fiber diameter, fiber surface morphology, substrate thickness and density. For example, thinner less dense fibrous materials can provide lower reflectance than thicker denser materials but, to some extent, that may be a trade-off for producing thinner circuit materials.

The porosity of the fibrous mat can be 10 to 85%, specifically 20% to 80%, wherein porosity characterizes the spaces between fibers which are defined by the tiny interstices or gaps between the fibers that form the mat. The "porosity" can be determined based on grams per square meter of the LCP fibrous mat, which in turn can determine how much fiber is present per square meter.

The reflective fibrous mats are diffuse reflectors, wherein diffuse reflectance is the process by which a light beam at a given incidence angle and luminous intensity is reflected from a material over a wide range of angles spreading the luminous intensity over these angles. In the ideal case, diffuse reflectance will produce a material that reflects light with equal luminance in all directions. While not wishing to be limited by theoretical explanations, it is believed that the high reflectance of such materials is due to Mie scattering arising from the nanoscale manipulation of the optical properties of an ultrathin fiber. The contrast in index of refraction between a nanofiber and air can create sites for Mie scattering of light and intensity of reflected light (i.e., backscattering) will be proportional to the angular scattering distribution and the number of scattering sites. In smooth fibers, the scattering sites are provided by the nanofibers themselves and the areas between adjacent nanofibers. Since the probability for backscattering (i.e., reflection) is optimal for visible radiation when this spacing is on the order of the wavelength of light, increasing substrate density (i.e., decreasing void volume) can improve reflection intensity up to a point.

The introduction of surface pores in the fibers can increase the number of scattering sites and increases backscattering efficiency as a function of thickness. In addition, surface pores of diameter 100-250 nm can be shown to possess a high probability for backscattering of visible radiation. Hence, porous nanofibers can be very efficient reflectors of visible radiation. Accordingly, in one embodiment, an additional mechanism to impart a discontinuity in the index of refraction is provided by the introduction of nanomaterials into the fibers in the fibrous mat material. In one embodiment, these nanomaterials will have diameters between 50 nm and 400 nm and can be composed of materials that are known to exhibit low absorbance in the visible spectrum. Examples of such materials include $BaSO_4$, Teflon, $TiO_2$, and $Al_2O_3$. Such additives can be selected to have an index of refraction different from that of the polymer used to make the fibers, to improve diffuse reflectance.

High-reflectance non-woven fibrous mats can exhibit diffuse reflection approaching Lambertian behavior. However, a certain amount of gloss (i.e., specular reflection) can be introduced into the substrate either by intentionally electrospinning in a manner that produces occasional larger features. Essentially, the electrospinning operation can be conducted in such a manner as to optionally produce flat, ribbon-shaped fibers. The width of such fibers can exceed 50 micrometers, the result being that a material that has "gloss" and exhibits some specular reflection, as compared to a fiber structure that has little or no gloss in exhibiting diffuse reflection. The making of fibers that are flat or ribbon-shaped has been described in PCT published application WO 2009-140381.

In a conventional electrospinning system, for example, a polymer solution (2-10 percent by weight) can be mixed with an additive that is not volatile but that is characterized by a high dielectric constant relative to the polymer in order to achieve surface porosity, wherein the dielectric constant of the additive compound in one embodiment is in the range of 50-189. In one embodiment, N-methylformamide is used as a liquid organic compound with a suitably high dielectric constant and is added to the solvent mixture at a weight percentage of 1-20 wt. %. Toluene can be used with the N-methylformamide and, in one embodiment, toluene is used in the electrospinning mixture as a large weight percent of the mixture, for example in a range of the 80-99 wt. %. Porous poly(methyl methacrylate) PMMA polymer nanofibers have thusly been produced, as described in WO 2009-140381, from toluene/methyl formamide/PMMA compositions. Such process can be modified using other polymers, as will be appreciated by the skilled artisan.

In any case, as would be evident in scanning electron microscopy (SEM) images, the addition of high dielectric constant compound, such as N-methylformamide, can make fibers porous and eventually into a ribbon shape, as compared with round, cylinder shape for smooth fiber prepared with a single solvent system. The pores on fibers can, range in shape from slightly elongated shapes to oval shapes and can have an aspect ratio in the range of 1.1:1 to 10:1. Such pores are partially embedded into the surface of the fiber and in some instances have an estimated depth of 5-100 nm, although smaller pore depths may not be readily detectable. The pores can have an estimated length from 5-100 nm, although smaller pore lengths may not be readily detectable. The pores can thus expose an interior surface of a nanofiber, providing for an increased surface area, as compared to a similar diameter nanofiber without pores. Adjacent pores can be totally separated from each other by a nanofiber wall material in between, or adjacent pores can partially overlap forming larger cavities in the nanofibers.

Examples of other high dielectric constant compounds for making porous fibers can include, but are not limited to: N-methylformamide, N-methylacetamide, N-methylpropanamide, N-ethylacetamide, N-propylpropanamide, formamide, N-butylacetamide, N-ethylformamide, and their compatible solvents can include, but are not limited to: toluene, dimethylformamide, chloroform, dichloromethane, dimethylacetamide, and acetone.

A reflective fibrous mat for use herein can include additives such as high dielectric constant materials (e.g., ZnO, $BaSO_4$, $TiO_2$, $Al_2O_3$, etc.) which can provide additional scattering sites and increase reflectance. These additives can be dispersed into an electrospinning solution and a composite of the nanofiber and high dielectric constant material can be provided directly by electrospinning operation. In one embodiment, random, textured (i.e., porous) nanofibers are effective for use in improved reflectance properties of a solder mask or cover for a solder mask, as discussed above. More specifically, the nanofiber substrate can be coated with the high dielectric constant material using methods described in U.S. Patent Application 2008/0113214, herein incorporated by reference. Alternatively, high dielectric constant materials such as for example ZnO, $BaSO_4$, $TiO_2$, $Al_2O_3$, etc. can be applied to the fiber mats after electrospinning.

In one embodiment of a conventional electrospinning system suitable for deposition of fibers, for example nanofibers, the system includes a chamber surrounding an electrospinning element, wherein the electrospinning element is configured to electrospin a substance from which fibers are composed to form fibers. The electrospinning system can include a collector disposed from the electrospinning element and configured to collect the fibers. The electrospinning element communicates with a reservoir supply containing the electrospray composition comprising, for example, a preselected polymer solution. Both polymer solutions and/or melts known in the art can be subject to electrospinning. Polymers and solvents suitable for electrospinning can include, for example, polystyrene in dimethylformamide or toluene, poly(ethyleneoxide) in distilled water, poly(methyl methacrylate) PMMA in acetone, dimethyl formamide (DMF), or N-methyl formamide (NMF), polyacrylonitrile in dimethylformamide, nylon in formic acid or acetic acid, and poly(vinyl alcohol) in distilled water and combinations thereof. In general, suitable solvents include both organic and inorganic solvents in which polymers can be dissolved. The polymer materials when formed are specifically organic materials that provide reflective materials, although the polymers may be spun with additives to increase reflectance.

In one embodiment, for use in a diffusively reflective solder mask, the fibers are formed from a thermoplastic polymer, more specifically a polycondensation polymer, having a melting point or transition glass temperature of at least 260° C. Examples of such polymers include polyester resins; polyamide resins; polyamides (specifically at least partially aromatic polyamides), polyamideimides, liquid crystalline polymers, polyimides, polyetherimides, polyaryletherketones, polyether ether ketone, and polyphenylene sulfides, epoxies, and unsaturated polyesters, and combinations thereof. Examples include polysulfone, polyethersulfone, polyphenylsulfone, and polyphthalamide polymers. The specific polymers can be selected based on their melting point or transition glass temperature of at least 260° C. In another embodiment, when such heat-resistance is not necessary, for example after soldering, the polymers can be selected from the group consisting of polyamides, polyacrylates, polymethacrylates, polyesters, polyolefins, polyvinyl alcohols, poly(acrylonitrile), poly(carbonate), and combinations thereof, specifically, for example, poly(methyl methacrylate), poly(butyl methacrylate), poly(benzyl methacrylate), and blends thereof.

In one embodiment the polymeric fibers can comprise aromatic liquid crystal polyester having a melting point or glass transition temperature of 260° C. or more. Such polymers can be obtained using p-hydroxybenzoic acid as a raw material monomer. In addition, other known aromatic hydroxycarboxylic acids, aromatic dicarboxylic acids, and aromatic dihydroxy compounds can be used. Examples thereof include polyesters obtained only from aromatic hydroxycarboxylic acids such as p-hydroxybenzoic acid and 2-hydroxy-6-naphthoic acid, and liquid crystal polyesters obtained from such polyesters and an aromatic dicarboxylic acid such as terephthalic acid, isophthalic acid, and 2,6-naphthalenedicarboxylic acid and/or an aromatic dihydroxy compound such as hydroquinone, resorcin, 4,4'-dihydroxydiphenyl, and 2,6-dihydroxynaphthalene.

Specifically, aromatic liquid crystal polyesters can obtained by polycondensation of 80 to 100 mole % of p-hydroxybenzoic acid (I), terephthalic acid (II), and 4,4'-dihydroxybiphenyl (III) (including derivatives thereof) (in which the total of (I) and (II) is 60 mole % or more) and 0 to 20 mole % of other aromatic compounds capable of a polycondensation reaction with any of (I), (II), and (III). Fibers comprising liquid crystal polymers and their preparation are further described below. Aromatic thermotropic liquid crystal polyester can be produced by carrying out melt polycondensation, as will be appreciated by one of ordinary skill in the art.

In another embodiment, the polymeric fibers can comprise a polyamide polymer in which its main chain has an acid amide bond (—CO—NH—). The polyamide is not particularly limited so long as it has a melting point or transition glass temperature of at least 260° C. Examples of the polyamide resins include Nylon 4T, 6, 6.6, 6.10, 6.11, 6.12, 6T, 6/6.6, 6/12, 6/6T, 6T/6I, 9T, 10T, 11T, 12T, 6T/66, 10T/1012, 6I/66, 6T, 6T/6I/66, and the like, and combinations thereof. These can be used singly or in combination of two or more types thereof. The ends of the polyamide-based resin can be terminated by a carboxylic acid, an amine or the like.

The polyamide resin can be prepared by polymerizing dicarboxylic acid and diamine. Exemplary dicarboxylic acids include without limitation aromatic carboxylic acids such as terephthalic acid, isophthalic acid, 2-methyl terephthalic acid, naphthalene dicarboxylic acid, phthalic anhydride, trimellitic acid, pyromellitic acid, trimellitic anhydride, pyromellitic anhydride, and the like; alkane carboxylic acids such as asoxalic acid, malonic acid, succinic acid, glutaric acid, adipic acid, pimelic acid and the like; and combinations thereof. Exemplary diamines include without limitation C5-C30 aromatic diamines, C1-C30 aliphatic diamines, C5-C30 alicyclic diamines, and combinations thereof. In an exemplary embodiment, the modified polyamide based thermoplastic resin is nylon 6T, which is prepared by condensation polymerization of hexamethylenediamine and terephthalic acid.

Another kind of polyamide polymer is polyphthalamide, a thermoplastic resin that is a semi-crystalline material made from a diacid and a diamine. The diacid portion can contain at least 55% terephthalic acid (TPA) or isophthalic acid (IPA). The TPA or IPA aromatic units serve to raise the melting point, glass transition temperature, and generally improve chemical resistance versus standard aliphatic nylon polymers. Suitable polyphthalamides can be formed by a polycondensation reaction between at least one aromatic dicarboxylic acid and a diamine. Polyphthalamides (PPA) are commercially available manufactured from various sources, for example under trade names AMODEL, ULTRAMID, and ZYTEL.

Other aromatic polycondensation polymers for use in the making the polymeric fibers can include polyarylethersulfones, which are defined as polyarylene compounds in which arylene units exist irregularly or regularly together with ether and sulfone linkages. Polyarylethersulfones can include polyphenylsulfone, polysulfone, polyethersulfone, and polyetherethersulfone. Polysulfone and polyarylethersulfones are commercially available under UDEL and RADEL trademarks from Solvay Advanced Polymers, L.L.C. Polyarylethersulfones can also be prepared as described in U.S. Pat. No. 4,175,175. Other aromatic polycondensation polymers can include, for example, polyamideimides, polyimides, polyetherimides, polyaryletherketones, and polyphenylene sulfides.

The fibers in the diffusively reflective fibrous mat can be made from thermoplastic composition comprising a blend of blend of one or more of the above-described polymers.

In making the fibers by electrospinning, a high voltage source can be provided to maintain an electrospinning element at a high voltage. A collector can be placed 1 to 100 cm away from the tip of the electrospinning element. A collector can be a plate or a screen. Typically, electric field strength between 2,000 and 400,000 V/m is established by the high voltage source. Typically, the collector is grounded and the fibers produced by electrospinning from the electrospinning elements are directed by the electric field toward the collector. The electric field pulls the polymeric composition from which the fiber is to be composed as a filament or liquid jet of fluid from the tip of the electrospinning element, wherein a supply of the polymeric composition to each electrospinning element is balanced with the electric field strength responsible for extracting the substance from which the fibers are to be composed so that a droplet shape exiting the electrospinning element can be maintained constant. Different electrospinning elements can be used to generate a fibrous mat material of mixed fibers of different sized fibers. The fibrous mat material can have for example one side of the substrate with a larger average fiber diameter than another side of the fibrous mat material.

Specifically, the polymeric fibers in the reflective fibrous mat can have a diameter of 1 to 1000 nm, specifically 10 to 1000 nm, and the polymeric fibers, when laid down on a collecting substrate, can be formed to a length of 10 cm to over 1 meter. Specifically, the polymeric fibers can be spun to a length greater than 50 cm, more specifically greater than 100 cm, as will be evident by the limited number of fiber breaks in the fibrous mat material in comparison to chopped fibers.

The reflective fibrous solder mask (or solder mask cover), as prepared, can be applied to the LED assembly, which can comprise a submount for supporting one or more LEDs that, in turn, can comprise a dielectric layer and a core substrate layer. The submount can comprise any suitable mounting submount or substrate, for example, a printed circuit board (PCB), a metal core printed circuit board (MCPCB), an external circuit, or any other suitable submount or substrate over which lighting devices such as LEDs can mount and/or attach. For illustration purposes, a submount comprises a MCPCB. The core substrate layer can comprise a conductive metal layer, for example Cu or aluminum (Al). The dielectric layer insulating the core substrate layer can comprise an electrically insulating but thermally conductive material to assist with heat dissipation through the submount.

In one embodiment, a so-called emission area can surround the one or more LEDs can be disposed on the submount. For example, the emission area can be disposed substantially centrally with respect to the LED assembly or in any location over the LED submount. In one embodiment, the emission area can comprise a substantially circular shape or any other suitable shape, for example, a substantially square, oval, or rectangle shape. The emission area can be in electrical and/or thermal communication with the submount. One or more intervening layers can be disposed between an emission area and submount such that the emission area is indirectly disposed over the submount, thereby indirectly electrically and/or thermally communicating with the submount. In the alternative, the emission area can directly mount over the submount thereby directly electrically and/or thermally communicating, or connecting, with the submount.

The LED assembly can comprise one or more electrical attachment surfaces comprising electrical contacts, specifically solder contacts. Attachment surfaces can be any suitable configuration, size, shape and/or location and can comprise positive and negative electrode terminals through which an electrical current or signal can pass when connected to an external power source. One or more electrically conductive wires can be attached and electrically connected to attachment surfaces when using conventional welding or soldering methods. Thus, electrical current or signal can pass into the LED assembly from the external wires electrically connected to the attachment surfaces and into the emission area to facilitate light output from the one or more LEDs in the emission area. Specifically, attachment surfaces can electrically communicate with conductive traces leading to the one or more LEDs electrically connected using electrical connectors. Electrical connectors can comprise wirebonds or other suitable members for electrically connecting LEDs to conductive traces, as would be appreciated by one of ordinary skill in the art. A solder mask made from the nanofibers mat described above can be disposed, for example, at least partially between conductive traces and attachment surfaces and/or between conductive traces and conductive pads. For example, the solder mask can comprise a substantially circular arrangement around conductive pads or any other conventional design, as can be appreciated by the skilled artisan. In general, the solder mask electrically isolates the electrical traces from the environment.

In one embodiment, as described above, a solder mask comprised of the reflective fibrous mat material, can be suitably die-cut or otherwise shaped, and then adhesively applied to the LED assembly using an adhesive material to provide sufficient adhesion to the relevant surfaces of the LED assembly over which the solder mask is applied. Areas of low adhesion is to be avoided, since that would obviously result in premature loss of the solder mask via flaking, chipping, or other such degradation, resulting in the solder mask no longer isolating the electrical traces and, furthermore, changing the optical properties of that part of the LED assembly. Thus, effective adhesion is necessary to advantageously improve and/or provide good electrical isolation and optical properties. Optical properties of the LED assembly can be improved due to improved reflectivity of light from the LED emission area via the reflective solder mask as described herein.

In another embodiment, a diffusively reflective fibrous mat for providing improved reflectance can be applied to an LED assembly having a metal core substrate insulated by a metal oxide or other ceramic dielectric layer. Thereafter, the ceramic dielectric insulation layer can be coated with a metallic seed layer and, before applying electrically conductive metal layers, a resist coating can be applied to the ceramic dielectric layers, the resist can be exposed and developed, the electrically conductive metal layers can be plated over the ceramic insulating dielectric layers in areas where the resist has been developed, the resist can be stripped, and the metallic seed layers can be removed from areas that have not been plated with electrically conductive metal layers. Through-hole vias in the insulated metal substrate can be filed with a metal paste, for example, a copper paste, and the electrically conductive metal layers on opposite sides of the metallic core substrate screen printed. The surface of the copper layer can be coated with another metal, for example silver in order to protect the copper form oxidation and provide improved solderability. Finally, in this embodiment, after plating copper onto the surface of the insulated metallic core substrate, an electronic device is mounted onto a surface of the circuit material to provide an assembly comprising the LED electronic device or "chip." In one embodiment, the electronic device can be an HBLED.

Subsequently, a diffusively reflective fibrous mat as described above can be employed as a solder mask or as a cover for a conventional solder mask. Optionally, before or after applying the reflective fibrous mat, the circuit material can be divided into a plurality of separate panels, each of which is about 4.5 inches by 4.5 inches (or within 50 percent, specifically within 30 percent, more percent within 10 percent of each dimension), as is a standard size for an individual LED unit or package.

In a more specific embodiment, the method of making a circuit material for the LED assembly can comprise providing an aluminum core substrate that is thermally conductive, drilling or otherwise forming at least one through-hole via in the metallic core substrate, forming aluminum oxide or aluminum nitride dielectric layers on opposite sides and in the via of the metallic core substrate, optionally coating the dielectric layers with an inorganic adhesion-improving material, wherein the method further comprises patterning electrically conductive metal layers. Specifically, the conductive metal layers can be patterned, in one embodiment, by applying a resist coating to the seed layer coated metal oxide dielectric layers and then, after exposing and developing the resist, plating copper over the surface of the dielectric layers, stripping the resist, and then etching or otherwise removing the inorganic adhesion-improving material (for example, a sputter coated metal seed layer) from the non-plated areas of the dielectric layers, thereafter applying a solder mask in accordance with the present invention prior to soldering the assembly.

The first electrically conductive metal layer and the second electrically conductive metal layer, on opposite sides of the metallic core substrate, can be formed by a process selected from screen printing, metal ink printing, electroless metallization, galvanic metallization, chemical vapor deposition (CVD), and plasma vapor deposition (PVD) metallization. Thus, metallic foils or flex circuits can be eliminated. The electrically conductive metal layers can be patterned, as discussed further below, or un-patterned. The circuit material can advantageously be in the form of a panel having an area that is 15 to 20 times the area of a conventional panel that is 4.5 inches by 4.5 inches (ceramic blanks having an image area of 4 inches by 4 inches). Subsequently, such larger panel can be divided into individual units or used for making larger individual panels. For example, a circuit material that is 14 by 22 inches can be produced. A panel that has 14 inch by 22 inch dimensions, for example, can allow for an array of 3×5 panel images or the equivalent of 15 of the 4.5 inch×4.5 inch panels.

In view of the above, a light-emitting diode assembly comprising one or more light emitting diodes attached to a circuitized substrate, further comprising, on the surface of the circuitized substrate, high-reflectance non-woven fibrous mat of polymeric fibers such that the fibrous mat diffusively reflects light, thereby increasing the reflectivity of the light from the one or more light emitting diodes. The high-reflectance non-woven fibrous mat can been used as a solder mask employing a polymeric material that is heat resistant to the solder used in preparing the light-emitting diode assembly or the non-woven fibrous mat of polymeric fibers can be non-solder-resistance and form a layer covering a solder mask, applied after the soldering of wire leads has been applied to the circuitized substrate.

In another embodiment, a light-emitting diode assembly can comprise a light emitting diode mounted on a circuitized substrate and having a high-reflectance non-woven fibrous mat of polymeric fibers that diffusively reflects light, wherein the polymeric fibers that have been made by a process of electrospinning in which polymeric fibers, formed at a length of at least 10 cm, have been laid down substantially in a random direction during electrospinning, wherein the fibers have a diameter of 10 to 1000 nm, the fibrous mat has a thickness of 25 to 250 micrometers, and wherein the reflective mat of fibers has a reflectivity in the range from 380 nm to 750 nm of at least 85 percent. A fibrous mat of predetermined shape can be applied to the circuitized substrate, either by using adhesive to attach the fibrous mat of predetermined shape or by directly and selectively forming a fibrous mat on the circuitized substrate during electrospinning optionally using, for example, screen printing.

More specifically, a light-emitting diode assembly can comprise a light emitting diode mounted on a circuitized substrate and having a solder mask comprising a high-reflectance non-woven fibrous mat of polymeric fibers for diffusively reflecting light, wherein the high-reflectance non-woven fibrous mat comprises a polymeric material that is heat resistant to the solder used in preparing the light-emitting diode assembly and has been applied before soldering of wire leads on the circuitized substrate, wherein the fibrous mat material comprises polymer fibers that have been made by a process of electrospinning in which the polymeric fibers have been (i) spun to a length of at least 10 cm and (ii) laid down in a substantially random orientation, the fibers having a diameter of 10 to 1000 nm and the fibrous mat having a thickness of 25 to 250 micrometers, wherein the fibrous mat has a reflectivity in the range from 380 nm to 750 nm of 85 to 98 percent. Alternatively, the fibrous mat can be applied as a solder mask after soldering of wire leads has been performed on the circuitized substrate.

In another embodiment, non-woven fibrous mats can be obtained, for use in making circuit materials, using a centrifugal force spinning process. This process can also produce relatively long fibers (essentially or substantially continuous). The fibers in the fibrous mat can exhibit a standard deviation of at least 10 degrees relative to a vertical (specifically a central longitudinal axis of the fibrous mat that is produced by forced spinning). Specifically, the fiber in the fibrous mat can exhibit a standard deviation of at least 15 to 45 degrees, more specifically a standard deviation of 20 to 40 degrees, depending on such factors as the speed of angular rotation used in forming the fibers, wherein the lesser the angular rotation, the more random the orientation of the fibers (and the closer to 45 degrees).

Force spinning is a known method for making nanofibers or microfibers out of polymers. For example, FibeRio Technology Corp. (McAllen, Tex.) manufactures commercially available force spinning equipment for making nanofibers and mat materials out of nanofibers. Advantageously, force spinning can make nanofibers either from polymers in solvents or by using molten polymers. Since liquid crystal polymers (LCPs) tend not to be very soluble in common solvents, melt spinning can be advantageously used for making LCP fibers.

In addition to obtaining dielectric substrates or layers having a lower thickness than dielectric layers based on conventional glass fabrics, non-woven LCPs can exhibit comparatively greater strength in thinner circuit laminates than conventional LCP fiber mats, for example, those made by Kuraray under the trade name Vecrus®. Furthermore, the present mats are characterized by being less anisotropic than the Vecrus® mats from Kuraray. Another potential advantage of the present materials is that an improved dielectric constant and lower dissipation factor can be obtained through a broad range of frequencies. The substrates can exhibit excellent mechanical as well as electrical properties, for example, low CTE in all directions.

Due to the relatively small diameter of the fibers in the mat, which can be nanoscale (50-500 nm, specifically 200 to 400 nm in one embodiment), the dielectric properties of the mat can be spatially uniform at a very small scale compared to commercial glass mats/cloth, which can allow better digital signal propagation designs given that the copper channel width can be many times larger than the fiber diameter.

In particular, in one embodiment, very thin dielectric substrates can be efficiently and economically produced using liquid crystalline polymer ("LCP") fibrous mats wherein the liquid crystalline polymers forming the fibers of the mats can withstand the processing conditions used in the manufacture of circuit materials and circuits. Furthermore, such LCP fibrous mat does not adversely affect, to any undesirable extent, the dielectric or other properties of the dielectric substrate, for example, its flame retardance, moisture absorption, dimensional stability, and the like. Specifically, the fibrous mat can be produced by a process comprising heating a composition comprising a LCP polymer to form a molten material and placing the molten material in a reservoir of a heated structure that can be rotated at a rate of at least 500 revolutions per minute (RPM) to produce fibers from the molten material. In such process, the superfine fibers can be micron fibers, sub-micron fibers, or nanofibers.

In certain embodiments, the heated structure includes at least one opening and the material is extruded through the opening to create the fibers. In certain other embodiments, the structure includes multiple openings and the material is extruded through the multiple openings to create the fibers. The openings can be of a variety of shapes (e.g., circular, elliptical, rectangular, square) and of a variety of diameter sizes (e.g., 0.01-0.80 mm). When multiple openings are employed, not every opening need be identical to another opening, but in certain embodiments, every opening is of the same configuration. The openings can be defined by the walls of the structure holding the LCP composition for extrusion, which structure is rotated to force the LCP polymer through the openings by centrifugal force and optional pressure on the LCP composition.

The structure containing the LCP composition for force spinning can be heated and can take on a variety of configurations. For example, a heated structure can comprise, relatively simply, a syringe and a plunger as known to those of skill in the art. The process of forming the fibers in a non-woven fibrous mat can further comprise collecting the fibers that are formed by centrifugal force spinning. As used herein, "collecting" of fine fibers such as nanofibers refers to the fine fibers coming to rest against a fiber collection means, typically having a flat or curved planar surface, as will be appreciated by one of ordinary skill in the art.

In one embodiment, a device for use in a microfiber and/or nanofiber producing system includes a body having an internal cavity of the body configured to receive material to be produced into a fiber, wherein the body is couplable to a driver through a coupling member. During use, rotation of the body causes material in the body to be passed through one or more openings to produce microfibers and/or nanofibers. For example, in one embodiment, an apparatus for producing nanofibers comprises a driver configured to be rotated at 500 RPM or more; a spinneret coupled to the driver; and a nanofiber collection device; where the apparatus is configured to create nanofibers by rotating the spinneret with the driver, without subjecting the nanofibers, during their production, to an externally-applied electric field.

In one embodiment, the spinneret can comprise a syringe and plunger or other extruding structure having one or more openings through which the fiber material can be forced, wherein when the spinneret (and its tip opening) is configured to rotate about a spin axis. An apparatus for force spinning fibers generally employs centrifugal forces to transform material into fibers. Such apparatus is described in detail in the following U.S. Published Patent Applications, and the references cited therein: US Patent Publications 2009/0269429; 2009/0280325; 2014/0035178; and 2014/0035179, hereby incorporated by reference in their entireties.

In a force-spinning fiber-producing system, where the fibers are laid down on a substrate surface perpendicular to the axis of rotation, the spread of the fibers can be controlled such that the deposited fibers are as uniform as possible across the deposition width. Several system parameters influence, and can be adjusted, to control the spread of fibers. For example, rotational velocity, air flow through the system, and distance between the one or more openings, from which the fiber composition is extruded, and the specific collection substrate are among the system parameters than can be readily modified.

Conventional compositions used to form fibers in force spinning can be conveyed under pressure into a structural body containing the composition or material for fiber production. Pressurized feed of the fiber material can facilitate fiber production by forcing the material through the one or more openings in addition to the force provided by the rotational spinning of the structure defining the one or more openings from which the fiber material exits the rotating structure. A pressurized feed system can allow fibers to be ejected from the openings at a higher velocity. The fiber material can also be conveyed using air or an inert atmosphere such as nitrogen.

In both the melt and solution force spinning methods, the fiber material can be put into a fiber producing means that is spun at various speeds until fibers of desired dimensions are made. In the one embodiment, for example, a fiber material can be formed by melting an LCP polymer or, in another case, by dissolving a mixture of an LCP solute and a solvent to form a solution. Any solution or melt comprising an LCP polymer familiar to those of ordinary skill in the art can be employed. For solution spinning, a composition can be designed to achieve a desired viscosity. A surfactant or other relevant additive can be added to improve flow. In melt spinning, other additives such as an antioxidant can be including in the LCP composition.

As used herein a "solvent" is a liquid that at least partially dissolves the material. Non-limiting examples of solvents that can be used include solvents such as DMSO, toluene, xlylenes, alcohol, hexanes, ether, ethyl acetate, acetone, dichloromethane, chloroform, petroleum ether, dimethyl sulfoxide, dimethylformamide, or mixtures thereof. Additives can include, but are not limited to, thinners, surfactants, plasticizers, or combinations thereof.

In either the solution or melt force spinning method, as the fiber material is ejected from the one or more openings of a spinning body, thin jets of the material are simultaneously stretched and dried or stretched and cooled in the surrounding environment. Interactions, between the material and the environment at the high strain rate (due to stretching), can lead to solidification of the material into fibers, which can be accompanied by evaporation of solvent. By manipulating the temperature and strain rate, the viscosity of the material can be controlled to manipulate the size and morphology of the fibers that are created.

With appropriate manipulation of the process, fibers of various configurations can be formed that are substantially continuous, at least partially random in direction, and nonwoven. Various fiber shapes can be produced, such as circular, elliptical, rectangular (e.g., ribbon), or other shape.

In one embodiment, by controlling the process parameters, LCP fibers can be made in micron, sub-micron and nano-sizes, and combinations thereof. The LCP fibers produced can have a relatively narrow distribution of fiber diameters, although some variation in diameter and cross-sectional configuration can occur along the length of individual fibers and between LCP fibers.

The speed of rotation and the temperature of a LCP composition being force spun, as well as the cross-sectional shape, diameter size and angle of the openings (or "outlets") in a fiber producing means, all can be used to control the cross-sectional shape and diameter size of the fibers. Median lengths of fibers produced can vary. Referring to the fibers as formed and collected, they can have a median length from 1 cm to over 1 meter, specifically 10 cm to at least 50 cm. During the later manufacture of circuits or circuit materials, the fiber mats can be mechanically sub-divided for use in circuit materials which can affect the median length of fibers in the fibrous mat. However, the median length of the fibers in the final product will reflect the median lengths of the fibers originally forming into a fibrous mat by force spinning.

The temperature of a LCP composition formed into fiber can also influence fiber properties. In some embodiments, both resistance and inductance heaters can be used as heat sources to heat, directly or indirectly, the LCP composition in a fiber producing device. In certain embodiments, the fiber producing device is thermally coupled to a heat source that can be used to adjust the temperature of the fiber producing device before spinning, during spinning, or both before spinning and during spinning. The temperatures of a fiber producing device and/or the LCP composition to be spun can range widely and, for example, can be as high as 500° C.

The speed at which a fiber producing device is spun can also influence fiber properties. The speed of the fiber producing device can be fixed while the fiber producing device is spinning, or can be adjusted while the fiber producing device is spinning. Those fiber producing devices whose speed can be adjusted can, in certain embodiments, be characterized as variable speed fiber producing devices. In the methods described herein, the fiber producing device can be spun at a speed of about 500 RPM to about 25,000 RPM, or any range derivable therein.

In one embodiment, LCP fibers (for example, 10 cm or longer in length) are produced and collected to form a fibrous mat. In some embodiments, using continuous methods, a median length of over 1 meter, specifically 1 to 5 meters, can be obtained by force spinning, in forming a fibrous mat for use in making circuit materials. In a specific embodiment, the diameter of the fibers in the LCP fibrous mat can fall in the range of 1 nm to 10,000 nm, specifically 10 nm to 1000 nm, and the porosity of the fibrous mat can be 10 to 85%, specifically 20% to 80%, wherein porosity characterizes the spaces between fibers which are defined by the tiny interstices or gaps between the fibers that form the mat. As mentioned above, the "porosity" can be determined based on grams per square meter of the LCP fibrous mat, which in turn can determine how much fiber is present per square meter.

The composition for forming the LCP fibers comprises liquid crystalline polymers (sometimes abbreviated as "LCP"), which are a class of polymers well known for a variety of uses. Liquid crystalline polymers often consist of thermoplastic resins, although they can also be used as thermosets by functionalization or by compounding with a thermoset such as an epoxy. Liquid crystalline polymers are believed to have a fixed molecular shape, e.g. linear, or the like, due to the nature of the repeating units comprising the polymeric chain. The repeating units typically comprise rigid molecular elements. The rigid molecular elements (mesogens) are frequently rod-like or disk-like in shape and are typically aromatic and frequently heterocyclic. The rigid molecular elements can be present in either the main chain (backbone) of the polymer or in the side chains. When present in the main chain or in the side chains they can be separated by more flexible molecular elements, sometimes referred to as spacers.

For forming fibers, liquid crystalline polymers can be blended with polymers that are not liquid crystalline polymers, hereinafter referred to as non-liquid crystalline polymers, for example, polyimides. These blends are sometimes referred to as polymer alloys, and include blends with thermosetting and thermoplastic materials. Suitable non-liquid crystalline polymers and liquid crystalline polymer components are generally mixed in a weight ratio of 30:70 to 70:30, specifically up to 30 weight percent of a non-liquid crystalline polymer, more specifically less than 20 weight percent or none. The term liquid crystalline polymer includes such liquid crystalline polymer blends.

Both lyotropic and thermotropic liquid crystalline polymers can be useful. Suitable lyotropic liquid crystalline polymers include concentrated sulfuric acid solutions of poly(p-phenylene terephthalamide) (PPTA), silk fibroin aqueous solutions, and sericin aqueous solutions. Suitable thermotropic liquid crystalline polymers include liquid crystalline polyesters, liquid crystalline polycarbonates, liquid crystalline polyetheretherketones, liquid crystalline polyetherketoneketones, and liquid crystalline polyester imides, specific examples of which include (wholly) aromatic polyesters, polyester amides, polyamide imides, polyester carbonates, and polyazomethines. Useful thermotropic liquid crystalline polymers also include polymers comprising a segment of a polymer capable of forming an anisotropic molten phase as part of one polymer chain thereof and a segment of a polymer incapable of forming an anisotropic molten phase as the rest of the polymer chain, and also a composite of a plurality of thermotropic liquid crystalline polymers.

Representative examples of the monomers usable for the formation of the thermotropic liquid crystalline polymers include: (a) at least one aromatic dicarboxylic acid compound, (b) at least one aromatic hydroxy carboxylic acid compound, (c) at least one aromatic diol compound, (d) at least one of an aromatic dithiol ($d_1$), an aromatic thiophenol ($d_2$), and an aromatic thiol carboxylic acid compound ($d_3$), and (e) at least one of an aromatic hydroxyamine compound and an aromatic diamine compound. The monomers can sometimes be used alone, but can frequently be used in a combination of monomers (a) and (c); (a) and (d); (a), (b) and (c); (a), (b) and (e); (a), (b), (c) and (e); and the like.

Examples of the aromatic dicarboxylic acid compound (a) include aromatic dicarboxylic acids, such as terephthalic acid, 4,4'-diphenyldicarboxylic acid, 4,4'-triphenyldicarboxylic acid, 2,6-naphthalenedicarboxylic acid, 1,4-naphthalenedicarboxylic acid, 2,7-naphthalenedicarboxylic acid, diphenyl ether-4,4'-dicarboxylic acid, diphenoxyethane-4, 4'-dicarboxylic acid, diphenoxybutane-4,4'-dicarboxylic acid, diphenylethane-4,4'-dicarboxylic acid, isophthalic acid, diphenyl ether-3,3'-dicarboxylic acid, diphenoxyethane-3,3'-dicarboxylic acid, diphenylethane-3,3'-dicarboxylic acid, and 1,6-naphthalenedicarboxylic acid; and alkyl-, alkoxy- and halogen-substituted derivatives of the above-mentioned aromatic dicarboxylic acids, such as chloroterephthalic acid, dichloroterephthalic acid, bromoterephthalic acid, methylterephthalic acid, dimethylterephthalic acid, ethylterephthalic acid, methoxyterephthalic acid, and ethoxyterephthalic acid.

Examples of the aromatic hydroxy carboxylic acid compound (b) include aromatic hydroxy carboxylic acids, such as 4-hydroxybenzoic acid, 3-hydroxybenzoic acid, 6-hydroxy-2-naphthoic acid, and 6-hydroxy-1-naphthoic acid; and alkyl-, alkoxy- and halogen-substituted derivatives of the aromatic hydroxy carboxylic acids, such as 3-methyl-4-hydroxybenzoic acid, 3,5-dimethyl-4-hydroxybenzoic acid, 6-hydroxy-5-methyl-2-naphthoic acid, 6-hydroxy-5-methoxy-2-naphthoic acid, 2-chloro-4-hydroxybenzoic acid, 3-chloro-4-hydroxybenzoic acid, 2,3-dichloro-4-hydroxybenzoic acid, 3,5-dichloro-4-hydroxybenzoic acid, 2,5-dichloro-4-hydroxybenzoic acid, 3-bromo-4-hydroxybenzoic acid, 6-hydroxy-5-chloro-2-naphthoic acid, 6-hydroxy-7-chloro-2-naphthoic acid, and 6-hydroxy-5,7-dichloro-2-naphthoic acid.

Examples of the aromatic diol compound (c) include aromatic diols, such as 4,4'-dihydroxydiphenyl, 3,3'-dihydroxydiphenyl, 4,4'-dihydroxytriphenyl, hydroquinone, resorcinol, 2,6-naphthalenediol, 4,4'-dihydroxydiphenyl ether, bis(4-hydroxyphenoxy)ethane, 3,3'-dihydroxydiphenyl ether, 1,6-naphthalenediol, 2,2-bis(4-hydroxyphenyl) propane, and bis(4-hydroxyphenyl)methane; and alkyl-, alkoxy- and halogen-substituted derivatives of the aromatic diols, such as chlorohydroquinone, methylhydroquinone, t-butylhydroquinone, phenylhydroquinone, methoxyhydroquinone, phenoxyhydroquinone, 4-chlororesorcinol, and 4-methylresorcinol.

Examples of the aromatic dithiol ($d_1$) include benzene-1, 4-dithiol, benzene-1,3-dithiol, 2,6-naphthalene-dithiol, and 2,7-naphthalene-dithiol. Examples of the aromatic thiophenol ($d_2$) include 4-mercaptophenol, 3-mercaptophenol, and 6-mercapto-phenol. Examples of the aromatic thiol carboxylic acid ($d_3$) include 4-mercaptobenzoic acid, 3-mercaptobenzoic acid, 6-mercapto-2-naphthoic acid, and 7-mercapto-2-naphthoic acid.

Examples of the aromatic hydroxyamine compound and the aromatic diamine compound (e) include 4-aminophenol, N-methyl-4-aminophenol, 1,4-phenylenediamine, N-methyl-1,4-phenylenediamine, N,N'-dimethyl-1,4-phenylenediamine, 3-aminophenol, 3-methyl-4-aminophenol, 2-chloro-4-aminophenol, 4-amino-1-naphthol, 4-amino-4'-hydroxydiphenyl, 4-amino-4'-hydroxydiphenyl ether, 4-amino-4'-hydroxydiphenylmethane, 4-amino-4'-hydroxydiphenyl sulfide, 4,4'-diaminodiphenyl sulfide (thiodianiline), 4,4'-diaminodiphenyl sulfone, 2,5-diaminotoluene, 4,4'-ethylenedianiline, 4,4'-diaminodiphenoxyethane, 4,4'-diaminodiphenylmethane (methylenedianiline), and 4,4'-diaminodiphenyl ether (oxydianiline).

Thermotropic liquid crystalline polymers are prepared from monomer(s) as mentioned above by a variety of esterification methods such as melt acidolysis or slurry polymerization, or the like methods. The molecular weight of the thermotropic liquid crystalline polyester that can favorably be used can be about 2,000 to about 200,000, with about 4,000 to about 100,000 specifically useful. The measurement of the molecular weight can be, for example, by determination of the terminal groups of a compressed film thereof according to infrared spectroscopy, or by GPC.

Thermotropic liquid crystalline polymers can be used either alone or in mixture of at least two thereof. In one embodiment, the thermotropic liquid crystalline polymer used to make a fibrous mat, for use in a circuit material, is aromatic polyester having a melting point of at least 290° C. A specific thermotropic liquid crystalline polymer is 2-naphthalene carboxylic acid, 6-(acetyloxy)-polymer with 4-(acetyloxy) benzoic acid. Examples of specific commercial liquid crystalline polymers that can be used include, but are not limited to VECTRA®, commercially available from Ticona, Florence, Ky., XYDAR®, commercially available from Amoco Polymers, and ZENITE®, commercially available from DuPont, Wilmington, Del., among others.

Resin compositions for impregnating the non-woven fibrous mat described here can either comprise thermosetting or thermoplastic resins, or a combination thereof. Suitable thermosetting resin compositions are preferably flowable prior to cure, and substantially non-flowable after cure. Thus, suitable thermosetting resin compositions comprise a material having a viscosity effective to allow flow into interfiber spaces within a fibrous mat during manufacture, and sufficient curability to form a solid dielectric substrate material. Specific useful polymers include polyenes such as polybutadiene, polybutadiene copolymers, polyisoprene, polyisoprene copolymers, and polybutadiene-polyisoprene copolymers; epoxy resins; polyesters, such as those available under trade names DOLPHON, SYNTHITE, DOLFEX, and HI-THERM, from John C. Dolph Co., Monmouth Junction, N.J.; polyimides; silicones, such as those available from Wacker; bismaleimide triazine (BT) resins, benzoxazines, polystyrenes, poly(alkyl methacrylate)s, poly (alkyl acrylate)s, poly(arylene ether)s, polyaryletherketones and the like, and combinations comprising at least one of the foregoing polymers.

One type of thermosetting resin is a thermosetting polybutadiene and/or polyisoprene resin. As used herein, the term "thermosetting polybutadiene and/or polyisoprene resin" includes homopolymers and copolymers comprising units derived from butadiene, isoprene, or mixtures thereof. Units derived from other copolymerizable monomers can also be present in the resin, for example in the form of grafts. Exemplary copolymerizable monomers include but are not limited to vinylaromatic monomers, for example substituted and unsubstituted monovinylaromatic monomers such as styrene, 3-methylstyrene, 3,5-diethylstyrene, 4-n-propylstyrene, alpha-methylstyrene, alpha-methyl vinyltoluene, para-hydroxystyrene, para-methoxystyrene, alpha-chlorostyrene, alpha-bromostyrene, dichlorostyrene, dibromostyrene, tetrachlorostyrene, and the like; and substituted and unsubstituted divinylaromatic monomers such as divinylbenzene, divinyltoluene, and the like. Combinations comprising at least one of the foregoing copolymerizable monomers can also be used. Exemplary thermosetting polybutadiene and/or polyisoprene resin include but are not limited to butadiene homopolymers, isoprene homopolymers, butadiene-vinylaromatic copolymers such as butadiene-styrene, isoprene-vinylaromatic copolymers such as isoprene-styrene copolymers, and the like.

The thermosetting polybutadiene and/or polyisoprene resins can also be modified, for example the resins can be hydroxyl-terminated, methacrylate-terminated, carboxylate-terminated resins. Post-reacted resins can be used, such as such as epoxy-, maleic anhydride-, or urethane-modified butadiene or isoprene resins. The resins can also be cross-linked, for example by divinylaromatic compounds such as divinyl benzene, e.g., a polybutadiene-styrene crosslinked with divinyl benzene. Suitable resins are broadly classified as "polybutadienes" by their manufacturers, for example Nippon Soda Co., Tokyo, Japan, and Sartomer Company Inc., Exton, Pa. Mixtures of resins can also be used, for example, a mixture of a polybutadiene homopolymer and a poly(butadiene-isoprene) copolymer. Combinations comprising a syndiotactic polybutadiene can also be used.

The thermosetting polybutadiene and/or polyisoprene resin can be liquid or solid at room temperature. Suitable liquid resins can have a number average molecular weight greater than about 5,000, but generally have a number average molecular weight of less than about 5,000 (most preferably about 1,000 to about 3,000). Thermosetting polybutadiene and/or polyisoprene resins having at least 90 weight percent (wt. %) 1,2 addition can advantageously exhibit a greater crosslink density upon cure, due to the large number of pendent vinyl groups available for crosslinking. The polybutadiene and/or polyisoprene resin is present in the resin system in an amount of up to about 60 wt. % with respect to the total resin system, more specifically about 10 to about 55 wt. %, even more specifically about 15 to about 45 wt. %.

Other polymers that can co-cure with the thermosetting polybutadiene and/or polyisoprene resins can be added for specific property or processing modifications. For example, in order to improve the stability of the dielectric strength and mechanical properties of the electrical substrate material over time, a lower molecular weight ethylene propylene elastomer can be used in the resin systems. An ethylene propylene elastomer as used herein is a copolymer, terpolymer, or other polymer comprising primarily ethylene and propylene, for example an EPM copolymer (i.e., copolymers of ethylene and propylene monomers), or EPDM terpolymer (i.e., terpolymers of ethylene, propylene, and diene monomers). Liquid ethylene propylene diene terpolymer rubbers in which the diene is dicyclopentadiene are preferred. The molecular weights of the ethylene propylene rubbers are less than 10,000 viscosity average molecular weight. Suitable ethylene propylene rubbers include an ethylene propylene rubber having a viscosity average molecular weight (MV) of about 7,200, which is available from Uniroyal Chemical Co., Middlebury, Conn., under the trade name Trilene® CP80; a liquid ethylene propylene dicyclopentadiene terpolymer rubbers having a molecular weight of about 7,000, which is available from Uniroyal Chemical Co. under the trade name of Trilene® 65; and a liquid ethylene propylene ethylidene norbornene terpolymer, having a molecular weight of about 7,500, available from Uniroyal Chemical Co. under the name Trilene® 67. The ethylene propylene rubber can be present in an amount effective to maintain the stability of the properties of the substrate material over time, in particular the dielectric strength and mechanical properties. Specific amounts, for example, are up to about 20 wt. % with respect to the total weight of the resin system, more specifically about 4 to about 20 wt. %, even more specifically about 6 to about 12 wt. %.

Another type of co-curable polymer is an unsaturated polybutadiene- or polyisoprene-containing elastomer. This component can be a random or block copolymer of primarily 1,3-addition butadiene or isoprene with an ethylenically unsaturated monomer, for example a vinylaromatic compound such as styrene or alpha-methyl styrene, an acrylate or methacrylate such a methyl methacrylate, or acrylonitrile. Specifically, the elastomer can be a solid, thermoplastic elastomer comprising a linear or graft-type block copolymer having a polybutadiene or polyisoprene block, and a thermoplastic block that is derived from a monovinylaromatic monomer such as styrene or alpha-methyl styrene. Suitable block copolymers of this type include styrene-butadiene-styrene triblock copolymers, for example those available from Dexco Polymers, Houston, Tex., under the trade name Vector® 8508M, from Enichem Elastomers America, Houston, Tex., under the trade name Sol-T-6302,® and those from Fina Oil and Chemical Company, Dallas, Tex., under the trade name Finaprene® 401; styrene-butadiene diblock copolymers; and mixed triblock and diblock copolymers containing styrene and butadiene, for example those available from Shell Chemical Corporation, Houston, Tex., under the trade name Kraton® D1118X. Kraton® D1118X is a mixed diblock/triblock styrene and butadiene containing copolymer, containing 30 vol. % styrene. The optional polybutadiene- or polyisoprene-containing elastomer can further comprise a second block copolymer similar to that described above, except that the polybutadiene or polyisoprene block is hydrogenated, thereby forming a polyethylene block (in the case of polybutadiene) or an ethylene-propylene copolymer block (in the case of polyisoprene). When used in conjunction with the above-described copolymer, materials with greater toughness can be produced. An exemplary second block copolymer of this type is Kraton® GX1855 (commercially available from Shell Chemical Corp.), which is believed to be a mixture of a styrene-high 1,2-butadiene-styrene block copolymer and a styrene-(ethylene-propylene)-styrene block copolymer. Typically, the unsaturated polybutadiene- or polyisoprene-containing elastomer component is present in the resin system in an amount of about 10 to about 60 wt. % with respect to the total resin system, more specifically about 20 to about 50 wt. %, or even more specifically about 25 to about 40 wt. %.

Still other co-curable polymers that can be added for specific property or processing modifications include, but are not limited to, homopolymers or copolymers of ethylene such as polyethylene and ethylene oxide copolymers; natural rubber; norbornene polymers such as polydicyclopentadiene; hydrogenated styrene-isoprene-styrene copolymers and butadiene-acrylonitrile copolymers; unsaturated polyesters; and the like. Levels of these copolymers are generally less than 50 vol. % of the total resin system.

Free radical-curable monomers can also be added for specific property or processing modifications, for example to increase the crosslink density of the resin system after cure. Exemplary monomers that can be suitable crosslinking agents include, for example, di, tri-, or higher ethylenically unsaturated monomers such as divinyl benzene, triallyl cyanurate, diallyl phthalate, and multifunctional acrylate monomers (e.g., Sartomer® resins available from Arco Specialty Chemicals Co., Newtown Square, Pa.), or combinations thereof, all of which are commercially available. The crosslinking agent, when used, can be present in a resin system in an amount of up to about 20 vol. %, based on the total weight of the resin.

A curing agent can be added to the resin system to accelerate the curing reaction of the polyenes having olefinic reactive sites, for example an organic peroxide such as dicumyl peroxide, t-butyl perbenzoate, 2,5-dimethyl-2,5-di (t-butyl peroxy)hexane, α,α-di-bis(t-butyl peroxy)diisopropylbenzene, and 2,5-dimethyl-2,5-di(t-butyl peroxy) hexyne-3, all of which are commercially available. They can be used alone or in combination. Typical amounts of curing agent are from about 1.5 wt. % to about 10 wt. % of the total resin composition.

Other useful thermosetting resins are low molecular weight epoxy resins. Suitable epoxy resins can have weight averaged molecular weights ($M_w$) of about 2,000 to about 100,000, specifically about 3,000 to about 50,000, as measured, for example, by gel permeation chromatography (GPC); an epoxy equivalent weight (i.e., number averaged molecular weight per one epoxy) of from about 170 to about 2,000; and a melting point below about 140° C. Combinations of epoxy resins can be used.

The resin composition for the dielectric substrate, impregnated with a non-woven fibrous mat as disclosed herein can further comprise particulate fillers. Useful particulate fillers include, but are not limited to, mineral fillers such as titanium dioxide (rutile and anatase), barium titanate, strontium titanate, silica (particles and hollow spheres), including fused amorphous silica and fumed silica, corundum, wollastonite, fiberglass, $Ba_2Ti_9O_20$, glass spheres, quartz, boron nitride, aluminum nitride, silicon carbide, beryllia, alumina, and magnesia. The mineral fillers can be used alone or in combination. Specific mineral fillers are rutile titanium dioxide having a high dielectric constant, and amorphous silica have a low dielectric constant, thereby permitting a broad range of dielectric constants combined with a low dissipation factor to be achieved in the final product by adjusting the respective amounts of the two fillers in the composition. Organic particulate fillers can also be used, for example polyamides, including aramids; polyimides; fluoropolymers, including polytetrafluoroethylene and perfluorovinyl acetate; polyethers; polysulfides; polyolefins; and combinations comprising at least one of the foregoing types of organic polymers.

A range of filler particle sizes can be used, depending on the desired dielectric constant, the presence of other fillers, and like considerations. Suitable average particle sizes (measured using the particles longest dimension) can be from about 0.001 micrometer to about 10 micrometers. Combinations of particle sizes can also be used, for example particles having an average particle size of about 0.001 to about 0.01 micrometers, together with particles having an average particle size of about 1 to about 5 micrometers. A coarse particle size of about 0.5 to about 10 micrometers can be used; fine particle sizes of about 0.01 to about 0.1 micrometers can also be used.

To improve adhesion between the fillers and resin composition, coupling agents can be used. Useful coupling agents include those capable of adhering to both the surface of the filler and the resin composition. For example, a commercially available coupling agent is gamma-aminopropylsilsesquioxane, available under the trade names Silquest® A-1106, Silquest® A-1170, or Silquest® A-174, from OSI Specialties, Sisterville, W. Va.

The coupling agents can be used singly or in combination. In practice, the coupling agents (in an optional solvent) are applied to the filler before combination with the resin composition, although a mixture of resin composition and filler can be treated with the coupling agent. Where used, the coupling agent can be applied to the filler so as to result in an amount of about 0.001 to about 10 weight percent, specifically about 0.01 to about 1.0 weight percent, of the weight of the particulate filler.

The relative amounts of fibrous mat, resin composition (resin and optional additives such as crosslinking agents, curing agents, flame retardants, and the like, if present), and particulate filler (if present) can vary depending on the desired properties of the dielectric substrate. In general, the dielectric substrates can comprise, based on the total weight of the substrate, about 10 to about 60 wt. %, specifically about 15 to about 45 wt. %, and more specifically about 10 to about 40 wt. % of the fibrous mat, for example, a silica fibrous mat or LCP fibrous mat; about 20 to about 90 wt. %, specifically about 25 to about 70 wt. %, and more specifically about 30 to about 60 wt. %, of resin composition; and 0 to about 70 wt. %, specifically about 1 to about 60 wt. %, more specifically about 5 to about 50 wt. %, and even more specifically about 10 to about 45 wt. % of particulate filler.

In one embodiment, the resin composition can be impregnated with a fibrous mat as disclosed herein to make a prepreg, which prepreg can be manufactured as described in U.S. Pat. No. 6,071,836 to St. Lawrence et al., hereby incorporated by reference in its entirety. In particular, the fibrous mat, optionally in the form of a web, can be passed through a saturation tank which contains the resin composition and solvent and then through a pair a metering rolls. The fibrous mat or web then travels through a drying tower for a preselected period of time until the solvent in evaporated from the fabric reinforcement, thereby forming a prepreg which can be stored. Subsequently, a stack of one or more prepreg layers can be laminated between one or two sheets of conductive foil. This stack-up can then be densified and cured via lamination or a combination of lamination and oven backing.

Circuit laminates can be formed using a batch wise or semi-continuous process, wherein at least one layer of the impregnated fibrous mat, and any desired additional layers used to form the circuit or multi-layer circuit, are arranged in a desired order to form a stack. The stack is then placed in a press, which may or may not be evacuated to form a vacuum. The temperature, for example, can be increased at a rate of about 2 to about 10 C/minute. Once the temperature reaches the desired lamination temperature, the pressure can be increased to about 2 to about 3 MegaPascal (MPa). While the desired temperature depends upon the composition of the dielectric composite, the temperature in one embodiment is about 200° C. to about 350° C. The stack can be held at the desired temperature and pressure for a time sufficient for adherence of the layers, for example, about 5 to about 45 minutes. The resulting article can then cooled while maintaining the desired pressure. The article can be removed from the press when the temperature is about 100° C. or lower and stored until used.

In another embodiment, the resin composition can be impregnated with the fibrous mat in a solventless process as follows. The resin composition, as described above, including any optional components, e.g. coupling agents, crosslinkers, plasticizers, curing agents, or the like, are thoroughly mixed to form an intimate blend in conventional mixing equipment, in the absence of a solvent. While it can be possible in some instances to include particulate filler in the resin composition, filler is more typically applied as described below. The mixing temperature is regulated to avoid substantial decomposition or premature crosslinking or other reaction of the components. Where thermoplastic resins are used, mixing can occur in the melt. Mixing can continue until the components are uniformly dispersed throughout to form the resin composition to form a solventless resin composition.

Thus, a solventless resin composition can be used in vacuum pressure impregnation of the thin fibrous mat. In one embodiment, the fibrous mat is disposed on a carrier for ease of handling. The carrier can also provide reinforcement to the relatively fragile fibrous mat, thereby mitigating and stretching and/or tearing of the mat during processing. In general, the carrier is made from a material having low adhesion to the infiltrated mat. Suitable carriers can be solid or porous to an extent effective to improve the infiltration of the fibrous mat. The porosity should not be so great as to significantly adversely affect the removal of the impregnated mat from the carrier. During processing, the fibrous mat can be in any convenient shape, i.e., a sheet, stacked sheets, or rolled, for example onto a spool. In a specific embodiment, a continuous length of fibrous mat and carrier is co-wound onto a spool to form a roll.

In addition to, or in lieu of, combining the particulate filler with the resin composition, particulate filler can be incorporated into the dielectric substrate by combining the particulate filler and the fibrous mat prior to impregnation. For example, the particulate filler can be "dusted" onto the fibrous mat. The dusted-on particulate filler is then carried into the interfiber spaces of the fibrous mat by the flow of the resin composition. In an embodiment, the fibrous mat is contacted with particulate filler by a dusting process, the dusted fibrous mat (and carrier if used) is wound onto a spool to form a roll, and the roll is contacted with the resin composition under vacuum.

In one embodiment, the resin composition is initially contacted with the fibrous mat under vacuum. For example, the fibrous mat can be placed in a vacuum chamber, the chamber evacuated to the desired pressure, and the resin composition introduced to the chamber under vacuum. Upon contact with the mat, the resin composition flows into the interfiber spaces of the fibrous mat. Alternatively, the mat and the resin composition can be in contact prior to establishing a vacuum effective to impregnate the mat. An effective vacuum is readily determined by one of ordinary skill in the art, based on flowability of the resin, the time desired for impregnation, and like considerations. Suitable effective vacuum pressures can be about 0.01 (0.001 KPa) to about 700 Torr (93.3 KPa), more commonly about 1 (0.133 KPa) to about 300 Torr (40 KPa), even more specifically about 1 (0.133 KPa) to about 100 Torr (13.3 KPa). The impregnation is continued for a length of time effective to yield the desired level of impregnation. In general, an effective time can be about 1 minute to about 60 minutes, more specifically about 10 minutes to about 30 minutes.

The resin composition can be contacted with the fibrous mat at any temperature, specifically at ambient temperature or an elevated temperature effective to enhance infiltration of the resin composition. More specifically, the temperature is below the cure temperature and decomposition temperature of the resin. Excess cure of a thermosetting resin can adversely affect the flow properties of the resin composition during the contacting process. Suitable temperatures are readily determined by one of ordinary skill in the art, depending on the composition of the resin, the amounts and types of other components such as curing agents, catalysts, and the like, the vacuum used, the duration of the contacting process, and like considerations. Exemplary temperatures are about 30° C. to about 120° C. The temperature of the resin and the fibrous mat can be adjusted prior to contacting, during contacting, or both. In one embodiment, the temperature of the mat is adjusted to be higher than the temperature of the resin before contacting, for example about 5° C. to about 30° C. higher.

After contacting the resin composition with the fibrous mat under vacuum, the fibrous mat can then pressurized. Such pressurization induces additional flow of the resin composition into the interfiber spaces of the fibrous mat. Suitable pressures that can be used include atmospheric pressure and pressures that are in excess of atmospheric pressure, which can be readily determined by one of ordinary skill in the art based on the resin composition, the degree of vacuum used in the preceding step, the time used to complete impregnation, and like considerations. For example, a pressure of greater than about 760 Torr (103 KPa), more specifically greater than about 1,520 Torr (203 KPa), specifically greater than 2,280 Torr (304 KPa), can be used to effect complete infiltration of the resin composition. There appears to be no particular upper limit to the pressures to be used, other than those dictated by cost and the equipment available. Thus, pressures as high as 76,000 Torr (10,132 KPa) can be used, although an upper limit of 7,600 Torr (1,013 KPa) are generally more practicable.

Where a thermosetting resin composition is used, the impregnated fibrous mat can be partially or fully cured. Such cure can occur at any point after pressure has been applied to complete impregnation. In one embodiment, the impregnated fibrous mat is partially cured, i.e., "B-staged," after introducing the fibrous mat into the resin composition, but prior to further processing. In another embodiment, the impregnated fibrous mat is fully cured after impregnation, but prior to further processing. Cure can be affected by exposure to radiation, e.g. UV radiation, heat, or a combination comprising at least one of these, depending on the resin and initiator type. For example, the impregnated fibrous mat in the form of a roll is removed from the vacuum chamber, and then thermally treated in an oven or other heated environment to affect a partial or a full cure. Effective cure temperatures for many thermosetting resins can be about 200° C. to about 350° C., specifically about 220° C. to about 320° C., more specifically about 250° C. to about 280° C.

An uncured, B-staged, or fully cured impregnated fibrous mat can be subjected to a variety of processing steps known for the production of circuit materials. Other layers can be added to the impregnated mat, for example using by lamination, such as roll-to-roll lamination, coextrusion, calendaring, and the like. Where lamination or rolling is used, the layering is preferably at a temperature less than the melting point of the resin (e.g., about 10° C. less than the melting point). Curing and/or annealing can be carried out before or after layering.

Composites used in circuit materials can be annealed to remove any stresses contained within the films. While annealing can be used, it is believed that the materials formed as described above are low-stress to essentially stress-free in at least the core layer of dielectric substrate without annealing. Advantageously, this can afford circuit materials that are less prone to delamination after exposure to stresses of heat, cold, time, mechanical warping, localized mechanical stress, and electrical stresses. For example, a length of liquid crystalline fibrous mat can be co-wound under tension with a 2-mil (51 micrometer) thick skived polytetrafluoroethylene (PTFE) film to prevent sticking after impregnation, in which a ⅟₃₂-inch (0.79 mm) overhang of the PTFE layer at the edges of each roll. The co-wound roll can be impregnated as described above, wherein the temperature of the resin and roll dropped to 73.6° F. (23° C.)

during the 20-hour pressure phase. The roll can then be B-staged for 60 minutes at 107° C., followed by 105 minutes at 121° C. The resin content of the roll can be, for example 40 to 65 wt. %.

The impregnated fibrous mats are useful as dielectric substrates in circuit laminates. Useful conductive layers for the formation of circuit laminates include stainless steel, copper, aluminum, zinc, iron, transition metals, and alloys comprising at least one of the foregoing, with copper specifically useful. There are no particular limitations regarding the thickness of the conductive layer, nor are there any limitations as to the shape, size or texture of the surface of the conductive layer. The conductive layer has a thickness of about 3 micrometers to about 200 micrometers, specifically about 5 micrometers to about 180 micrometers, and more specifically about 5 micrometers to about 35 micrometers. Where two or more conductive layers are present, the thickness of the two layers can be the same or different.

Circuit laminates can be formed using a batch wise or semi-continuous process, wherein at least one layer of the impregnated fibrous mat, and any desired additional layers used to form the circuit or multi-layer circuit are arranged in a desired order to form a stack. The stack is then placed in a press, which can or cannot be evacuated to form a vacuum. The temperature is typically increased at a rate of about 2 to about 10° C./minute. Once the temperature reaches the desired lamination temperature the pressure is increased to about 2 to about 3 MegaPascal (MPa). While the desired temperature depends upon the composition of the dielectric composite, the temperature is typically about 200° C. to about 350° C. The stack is held at the desired temperature and pressure for a time sufficient for adhering layers, about 5 to about 45 minutes. The resulting article can then be cooled while maintaining the desired pressure. The article can be removed from the press when the temperature is about 100° C. or lower, and stored until used.

The circuit materials, circuits, and multi-layered circuits manufactured using the dielectric composite described herein have excellent properties, for example good dimensional stability and enhanced reliability, e.g., plated through-hole reliability, and excellent copper peel strength, particularly at high temperature. In particular the dielectric substrates can have a $D_k$ below about 3.45 and a $D_f$ of less than about 0.004 when measured at a frequency of 1 to 10 GHz. They can further have good dimensional stability and structural rigidity. The water absorption can be less than 0.05% at a relative humidity of 50%, specifically at a relative humidity of 90%. CTE in the machine direction can be greater than about 0.5 ppm, more specifically greater than about 1 ppm, most specifically greater than about 5 ppm, while CTE in the cross machine direction can be less than about 70 ppm, more specifically less than about 60 ppm, most specifically less than about 50 ppm.

The singular forms "a," "an," and "the" include plural referents unless the context clearly dictates otherwise. The endpoints of all ranges directed to the same characteristic or component are independently combinable and inclusive of the recited endpoint. All references are incorporated herein by reference. As used herein and throughout, "contacted" and variants thereof refers to the complete or partial physical contact between the respective materials, substrates, layers, films, and the like. Further, the terms "first," "second," and the like herein do not denote any order, quantity, or importance, but rather are used to distinguish one element from another.

While typical embodiments have been set forth for the purpose of illustration, the foregoing descriptions should not be deemed to be a limitation on the scope herein. Accordingly, various modifications, adaptations, and alternatives can occur to one skilled in the art without departing from the spirit and scope herein.

What is claimed is:

1. A dielectric substrate comprising a fibrous non-woven mat material having a thickness of less than 5 mils (127 micrometers) that is impregnated with a resin composition, wherein the fibrous non-woven mat material comprise fibers, 10 nm to 10 μm in diameter that have been made by a process of extruding an inorganic or organic material through one or more openings and collecting the extruded fibers in the form of a fibrous non-woven mat material, wherein the direction of the fibers on the surface of the fibrous non-woven mat material exhibit a standard deviation of at least 10 degree with respect to a central longitudinal axis of the fibrous non-woven mat material.

2. The dielectric substrate of claim 1, wherein the fibers comprise liquid crystalline polymer and wherein the fibers have been made by a process of force spinning a composition comprising the liquid crystalline polymer through one or more openings as the one or more openings are rotated about an axis.

3. The dielectric substrate of claim 2, wherein centrifugal forces are employed to transform the liquid crystalline polymer into fibers for forming the fibrous non-woven mat material, and wherein the liquid crystalline polymer is extruded though the one or more openings at an angle to the axis of rotation.

4. The dielectric substrate of claim 2, wherein the fibrous non-woven mat material has been made by a force spinning process in which the composition comprising the liquid crystalline polymer has been forced through one or more openings rotated about an axis of rotation at a speed of about 500 RPM to about 25,000 RPM, wherein the fibers made by the force spinning process have been laid on a substrate for collecting the fibers, the substrate being substantially perpendicular to the axis of rotation.

5. The dielectric substrate of claim 2, wherein the fibers have been made by a process comprising melting liquid crystalline polymer or mixing the liquid crystalline polymer with a solvent to produce a mixture for force spinning though the one or more openings.

6. The dielectric substrate of claim 2, wherein the fibrous non-woven mat material comprises fibers that have been continuously formed during force spinning, wherein fibers having a length of 1 cm to over 1 meter have been collected in forming the fibrous non-woven mat material.

7. The dielectric substrate of claim 1, wherein the fibrous non-woven mat material comprises silica fibers having a diameter of 100 nanometers to 10 micrometers that have been made by a process of electrospinning a silica precursor sol-gel composition.

8. The dielectric substrate of claim 7, wherein the fibrous non-woven mat material comprises silica fibers that have been made by continuously electrospinning silica fibers to produce a substantially random arrangement of fibers with respect to a central longitudinal axis of the fibrous non-woven mat material.

9. The dielectric substrate of claim 7, wherein the fibrous non-woven mat material comprises fibers that have been continuously formed without breaks to a length of at least 10 cm.

10. The dielectric substrate of claim 1, wherein the direction of the fibers on the surface of the fibrous nonwoven mat material exhibit a random orientation with respect to a central longitudinal axis of the fibrous non-woven mat material.

11. The dielectric substrate of claim 1, wherein the fibrous non-woven mat material has inter-fiber porosity ranging from 20 to 80%.

12. The dielectric substrate of claim 1, wherein the resin composition is selected from the group consisting of epoxy resin, a polybutadiene, a polyisoprene, a polyester, a polyimide, a silicone, a bismaleimide triazine, a benzoxazine, a polystyrene, a poly(methacrylate), a polyacrylate, a poly(arylene ether), a polyaryletherketone, and combinations thereof.

13. The dielectric substrate of claim 1, further comprising a conductive layer directly adjacent the dielectric substrate or attached to the conductive layer by an adhesive layer that is less than 10 percent the thickness of the dielectric substrate.

14. The dielectric substrate of claim 13, wherein the conductive layer is circuitized.

15. A circuit comprising the dielectric substrate of claim 1.

16. A dielectric substrate comprising a fibrous non-woven mat material having a thickness of less than 5 mils (127 micrometers) that is impregnated with a resin composition, wherein the fibrous non-woven mat material comprise fibers, 100 nm to 10 μm in diameter, of silica or a liquid crystalline polymer, wherein the fibers have been made by a force spinning or electrospinning process and collected in the form of a fibrous non-woven mat material, wherein the direction of the fibers on the surface of the fibrous non-woven mat material exhibit a standard deviation of at least 10 degree with respect to a central longitudinal axis of the fibrous non-woven mat material.

17. A dielectric substrate comprising a fibrous non-woven mat material having a thickness of less than 5 mils (127 micrometers) that is impregnated with a resin composition, wherein the fibers of the fibrous non-woven mat material, having a diameter of 10 to 10000 nanometers, have been made by force spinning process a liquid crystalline polymer through one or more openings rotating about an axis at a speed of about 500 RPM to about 25,000 RPM, which openings were positioned to extrude the liquid crystalline polymer at an angle to the axis of rotation, thereby producing fibers that have been collected in the form of a fibrous non-woven mat material;

wherein centrifugal forces have been employed to transform the liquid crystalline polymer into fibers collected in the form of the fibrous non-woven mat material, wherein the liquid crystal polymer fibers on the surface of the fibrous non-woven mat material exhibit a directional orientation represented by a standard deviation of at least 10 degrees relative to a longitudinal central axis of the fibrous non-woven mat material, and wherein the liquid crystal fibers have not been exposed to mechanical division prior to collection in the form of a fibrous non-woven mat material.

* * * * *